United States Patent
Chen et al.

(10) Patent No.: US 11,508,677 B2
(45) Date of Patent: Nov. 22, 2022

(54) SEMICONDUCTOR PACKAGE FOR HIGH-SPEED DATA TRANSMISSION AND MANUFACTURING METHOD THEREOF

(71) Applicant: TAIWAN SEMICONDUCTOR MANUFACTURING COMPANY LTD., Hsinchu (TW)

(72) Inventors: Huan-Neng Chen, Taichung (TW); Wen-Shiang Liao, Miaoli County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/818,826

(22) Filed: Mar. 13, 2020

(65) Prior Publication Data

US 2021/0066219 A1  Mar. 4, 2021

Related U.S. Application Data

(60) Provisional application No. 62/893,596, filed on Aug. 29, 2019.

(51) Int. Cl.
*H01L 23/66* (2006.01)
*H01L 21/48* (2006.01)
(Continued)

(52) U.S. Cl.
CPC .......... *H01L 23/66* (2013.01); *H01L 21/4857* (2013.01); *H01L 23/49822* (2013.01);
(Continued)

(58) Field of Classification Search
CPC ............. H01L 21/4857; H01L 21/4846; H01L 2223/6627; H01L 2223/6677; H01L 25/50;
(Continued)

(56) References Cited

U.S. PATENT DOCUMENTS 5,798,469 A * 8/1998 Nufer .................. B22F 5/007
156/89.11
10,163,825 B1 * 12/2018 Liao .................. H01L 23/49811
(Continued)

FOREIGN PATENT DOCUMENTS

JP  2004146602 A  5/2004
TW  201839917 A  11/2018
(Continued)

OTHER PUBLICATIONS

J. Holloway, Z. Hu, and R. Han, "Broadband Inter-Chip Link Using a Terahertz Wave on a Dielectric Waveguide," Research Abstracts, Center for integrated Circuits and Systems, MIT, p. 10, May 2, 2018.
(Continued)

*Primary Examiner* — Lawrence C Tynes, Jr.
(74) *Attorney, Agent, or Firm* — WPAT; Anthony King

(57) ABSTRACT

A semiconductor structure and a method of forming the same are provided. A method of manufacturing the semiconductor structure includes: providing a substrate; depositing a first dielectric layer over the substrate; attaching a waveguide to the first dielectric layer; depositing a second dielectric layer to laterally surround the waveguide; and forming a first conductive member and a second conductive member over the second dielectric layer and the waveguide, wherein the first conductive member and the second conductive member are in contact with the waveguide. The waveguide is configured to transmit an electromagnetic signal between the first conductive member and the second conductive member.

20 Claims, 16 Drawing Sheets

(51) Int. Cl.
  *H01L 23/538* (2006.01)
  *H01L 23/00* (2006.01)
  *H01P 3/12* (2006.01)
  *H01L 23/498* (2006.01)
  *H01L 25/00* (2006.01)
  *H01L 25/18* (2006.01)

(52) U.S. Cl.
  CPC ...... *H01L 23/5383* (2013.01); *H01L 23/5386* (2013.01); *H01L 24/13* (2013.01); *H01L 25/50* (2013.01); *H01P 3/121* (2013.01); *H01L 25/18* (2013.01); *H01L 2223/6627* (2013.01); *H01L 2223/6677* (2013.01)

(58) Field of Classification Search
  CPC ........... H01L 23/49822; H01L 23/5383; H01L 23/5386; H01L 23/498; H01L 2224/02331; H01L 2224/023; H01L 2224/0231; H01L 2224/02373; H01L 24/02; H01P 5/087; H01P 3/16; H01P 3/121
  See application file for complete search history.

(56) References Cited

U.S. PATENT DOCUMENTS

| | | | | |
|---|---|---|---|---|
| 10,319,690 | B2* | 6/2019 | Liao | H01L 21/486 |
| 2004/0106252 | A1* | 6/2004 | Jeong | H01L 28/40 438/240 |
| 2004/0264837 | A1* | 12/2004 | Ogawa | H05K 3/4682 385/14 |
| 2008/0253728 | A1* | 10/2008 | Sparacin | G02B 6/122 385/132 |
| 2015/0214425 | A1* | 7/2015 | Taylor | H01L 31/1105 385/14 |
| 2016/0147088 | A1* | 5/2016 | Jou | G02B 6/122 385/2 |
| 2018/0315720 | A1* | 11/2018 | Liao | H01L 21/563 |
| 2019/0393171 | A1* | 12/2019 | Liao | H01L 21/4853 |
| 2020/0098710 | A1* | 3/2020 | Nair | H01L 23/66 |
| 2020/0118951 | A1* | 4/2020 | Aleksov | H01L 21/4857 |

FOREIGN PATENT DOCUMENTS

| | | |
|---|---|---|
| TW | 201917865 A | 5/2019 |
| TW | 201926585 A | 7/2019 |
| TW | I669791 B | 8/2019 |
| WO | WO2018/200059 | 11/2018 |

OTHER PUBLICATIONS

Schmidt, Rainer & Sinclair, Derek, "CaCu3Ti4O12 (CCTO) Ceramics for Capacitor Applications," Chaper 1 of Capacitors: Theory of Operation, Behavior and Safety Regulations, ISBN: 978-1-62417-586-2, 2013.

Titanium dioxide. [Online] [Retrieved on Jun. 3, 2019] Retrieved from the Internet:< URL: https://en.wikipedia.org/wiki/Titanium_dioxide>.

Properties of ACX's LTCC material compared with those of commercial materials. [Online] [Retrived on Jun. 3, 2019] Retrieved from the Internet:<https://www.acxc.com.tw/ltcc>.

Office Action and Search Report dated Jan. 12, 2021 issued by Taiwan Intellectual Property Office for counterpart application No. 109117536.

Office Action and Search Report dated May 11, 2021 issued by Taiwan Intellectual Property Office for counterpart application No. 109117536.

US Publication 20040264837serves as the English translation for JP2004146602A.

* cited by examiner

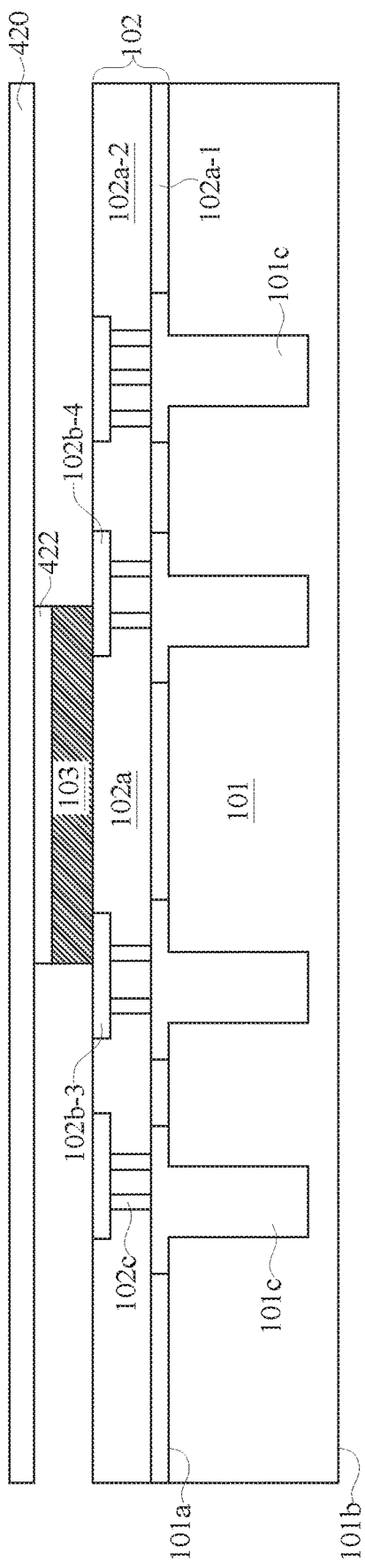
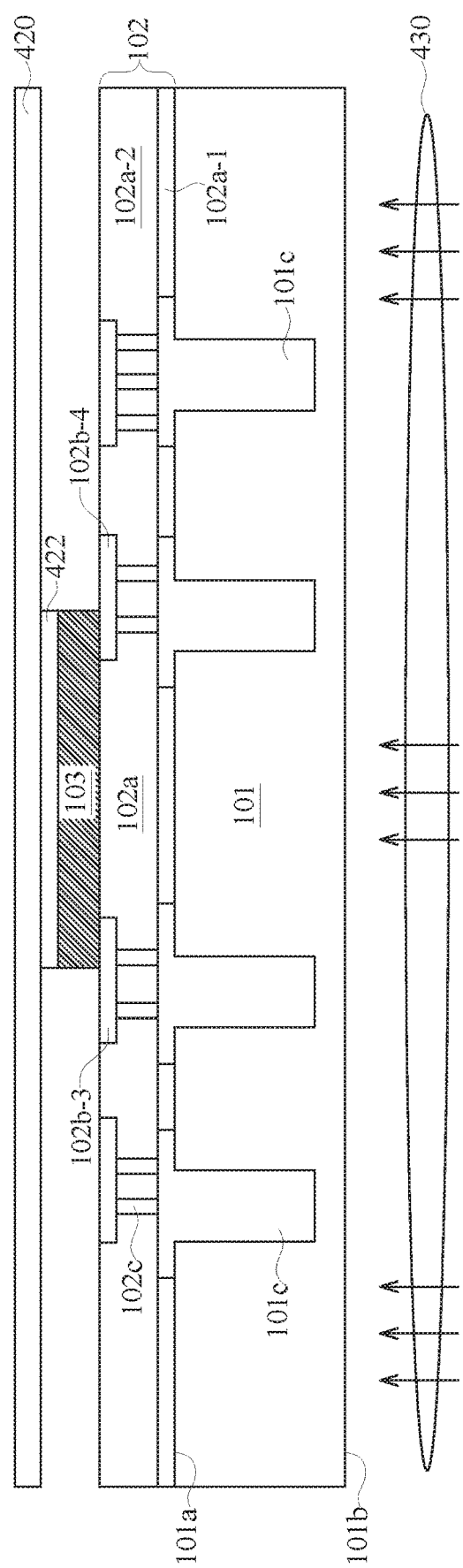
FIG. 4D
FIG. 4E

SEMICONDUCTOR PACKAGE FOR HIGH-SPEED DATA TRANSMISSION AND MANUFACTURING METHOD THEREOF

PRIORITY CLAIM AND CROSS-REFERENCE

This application claims priority to U.S. Provisional Application No. 62/893,596 filed Aug. 29, 2019, the disclosure of which is hereby incorporated by reference in its entirety.

BACKGROUND

Electronic equipment using semiconductor devices is essential for many modern applications. With the advancement of electronic technology, the semiconductor devices are steadily becoming smaller in size while having greater functionality and greater amounts of integrated circuitry. Due to the miniaturized scale of the semiconductor device, a chip on wafer on substrate (CoWoS) is widely used to integrate several chips into a single semiconductor device by through substrate via (TSV). During the CoWoS operation, a number of chips are assembled on a single semiconductor device. Furthermore, numerous manufacturing operations are implemented within the small semiconductor device.

However, the manufacturing operations of the semiconductor device involve many steps and operations on the small and thin semiconductor device. The manufacturing of the semiconductor device in a miniaturized scale becomes more complicated. An increase in complexity of manufacturing the semiconductor device may cause deficiencies such as poor structural configuration and delamination of components, resulting in a significant yield loss of the semiconductor device and increase of manufacturing cost. As such, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
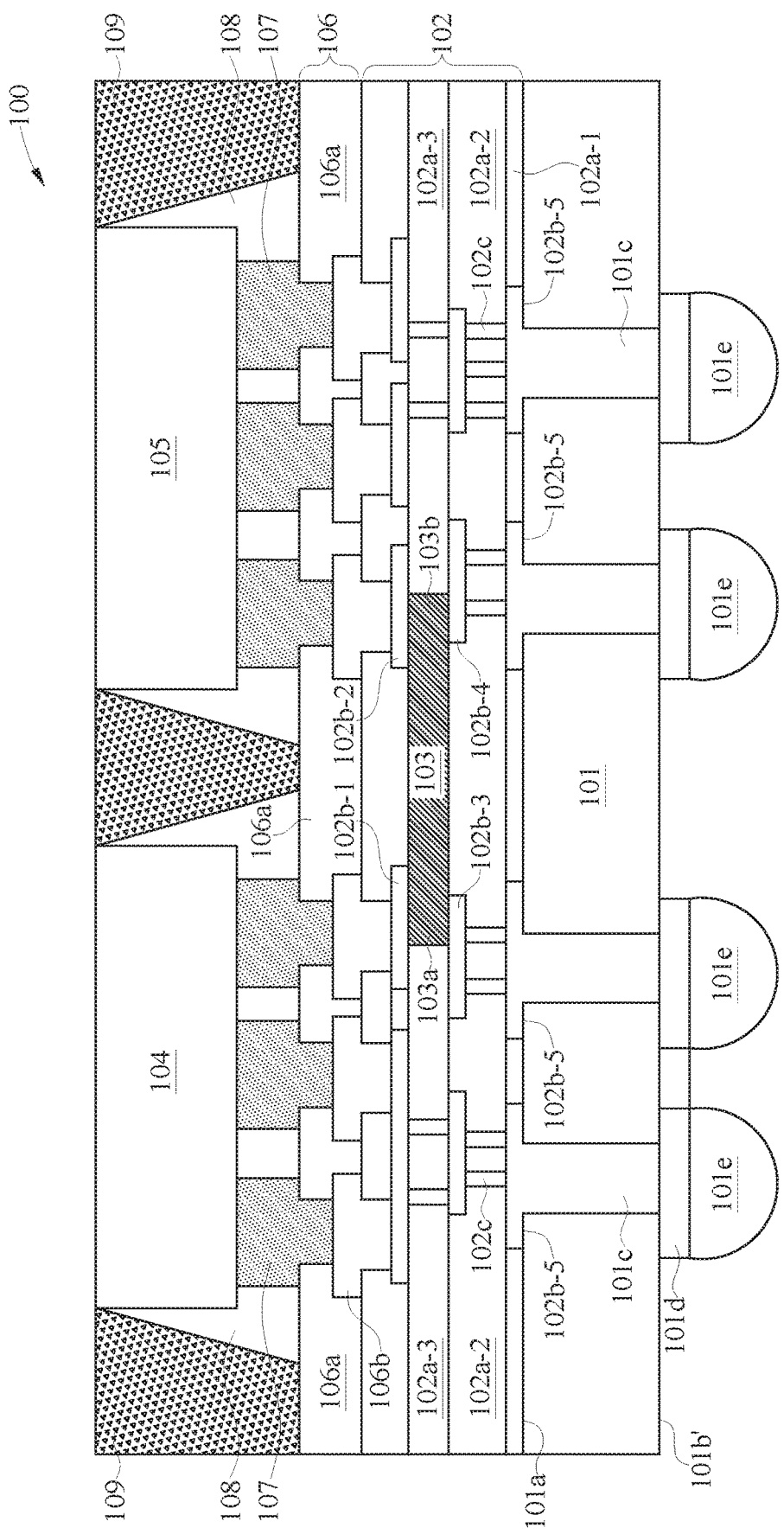
FIG. 1 is a schematic cross-sectional view of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" and "substantially" generally mean within 10%, 5%, 1% or 0.5% of a given value or range. Alternatively, the terms "about," "substantial" and "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

An electronic device including various semiconductor chips is manufactured by a number of operations. During the manufacturing process, the semiconductor chips with different functionalities and dimensions are integrated into a single module. Circuitries of the semiconductor chips are integrated and connected through conductive traces. The semiconductor chips communicate with each other by transmitting an electrical signal from one device to another device through the conductive traces. However, such transmission between the semiconductor chips may not satisfy a requirement of high communication speed between the semiconductor chips. As a result, performance of the electronic device may not be at a desired level.

In the present disclosure, a semiconductor structure and a method of forming the semiconductor structure are disclosed. The semiconductor structure includes a substrate, an interconnect structure disposed or deposited over the substrate and including a dielectric layer over the substrate, a first conductive member disposed within the dielectric layer and a second conductive member disposed or formed within the dielectric layer, a waveguide disposed or fabricated within the dielectric layer, a first die disposed over the interconnect structure and electrically connected to the first conductive member, and a second die disposed over the interconnect structure and electrically connected to the second conductive member, wherein the waveguide is coupled to the first conductive member and the second conductive member.

An electrical signal is transmitted from the first die to the first conductive member, and the electrical signal is converted to an electromagnetic signal. The electromagnetic signal is transmitted from the first conductive member to the second conductive member through the waveguide. When the electromagnetic signal is received by the second conductive member, the electromagnetic signal is converted to an electrical signal. The electrical signal is then transmitted from the second conductive member to the second die. The electromagnetic signal is non-visible radiation (e.g., radio wave, microwave, millimeter wave, or the like), providing a high data transfer rate (e.g., substantially greater than 10 gigabits per second, or greater than 100 gigabits per second) along the waveguide, and energy loss of the electromagnetic signal due to the waveguide can be minimized during the transmission.

FIG. 1 is a schematic cross-sectional view of a semiconductor structure 100 in accordance with various embodiments of the present disclosure. In some embodiments, the semiconductor structure 100 includes a substrate 101, an interconnect structure 102, a waveguide 103, a first die 104 and a second die 105.

In some embodiments, the semiconductor structure 100 is a semiconductor package. In some embodiments, the semiconductor structure 100 is an integrated fan out (InFO) package, where I/O terminals of the first die 104 or the second die 105 are fanned out and redistributed over a surface of the first die 104 or the second die 105 in a greater area. In some embodiments, the semiconductor structure 100 is a chip-on-wafer-on-substrate (CoWoS) packaging structure. In some embodiments, the semiconductor structure 100 is a three-dimensional integrated circuit (3D IC). In some embodiments, the semiconductor structure 100 is configured to perform an ultra-high speed signal transmission, e.g., a signal transmission at a speed substantially equal to or greater than 100 gigabits per second (Gbps), within the semiconductor structure 100. In some embodiments, the semiconductor structure 100 is configured to perform an ultra-high speed signal transmission at a high frequency, e.g., a signal transmission at a frequency substantially greater than about 100 gigahertz (GHz) within the semiconductor structure 100.

In some embodiments, the substrate 101 is a semiconductive substrate. In some embodiments, the substrate 101 includes semiconductive material such as silicon, germanium, gallium, arsenic, or a combination thereof. In some embodiments, the substrate 101 is an interposer or the like. In some embodiments, the substrate 101 is a silicon substrate or silicon interposer formed of bulk silicon. In some embodiments, the substrate 101 includes a material such as ceramic, glass, polymer or the like. In some embodiments, the substrate 101 includes an organic material. In some embodiments, the substrate 101 has a quadrilateral, rectangular, square, polygonal or any other suitable shape.

In some embodiments, the substrate 101 includes a first surface 101a and a second surface 101b opposite to the first surface 101a. In some embodiments, a via 101c extends in the substrate 101 through at least a portion of the substrate 101. In some embodiments, the via 101c extends between the first surface 101a and the second surface 101b. In some embodiments, the via 101c is formed as a conductive via and includes a conductive material such as copper, silver, gold, aluminum, tungsten, titanium, a combination thereof, or the like. In some embodiments, the via 101c is a through silicon via (TSV) extending through the thickness of the substrate 101.

In some embodiments, a first pad 101d is disposed beneath and electrically connected to the via 101c. In some embodiments, the first pad 101d is disposed over the second surface 101b of the substrate 101. In some embodiments, the first pad 101d includes metal or metal alloy. In some embodiments, the first pad 101d includes chromium, copper, gold, titanium, silver, nickel, palladium, tungsten or the like. In some embodiments, the first pad 101d is a solderable surface and serves as a platform for receiving a solder material and for electrically connecting a circuitry of the substrate 101 to an external component or circuitry.

In some embodiments, a first conductive bump 101e is disposed or fabricated beneath the substrate 101. In some embodiments, the first conductive bump 101e is fabricated over the second surface 101b of the substrate 101. In some embodiments, the first conductive bump 101e is fabricated beneath and electrically connected to the first pad 101d. In some embodiments, the first conductive bump 101e is electrically connected to the via 101c. In some embodiments, the first conductive bump 101e has a cylindrical, spherical or hemispherical shape. In some embodiments, the first conductive bump 101e is a solder joint, a solder bump, a solder ball, a ball grid array (BGA) ball, a controlled collapse chip connection (C4) bump or the like. In some embodiments, the first conductive bump 101e is a conductive pillar or post. In some embodiments, the first conductive bump 101e includes metal such as lead, tin, copper, gold, nickel, a combination thereof or the like.

In some embodiments, the interconnect structure 102 is disposed or deposited over the substrate 101. In some embodiments, the interconnect structure 102 is deposited over the first surface 101a of the substrate 101. In some embodiments, the interconnect structure 102 includes a dielectric layer 102a deposited over the substrate 101, several conductive members 102b disposed or formed within the dielectric layer 102a, and several conductive vias 102c disposed or formed within the dielectric layer 102a.

In some embodiments, the dielectric layer 102a includes one or more dielectric layers, e.g., a first layer 102a-1, a second layer 102a-2 and a third layer 102a-3 stacked over one another. In some embodiments, the dielectric layer 102a includes silicon dioxide, fluorine-doped silicon dioxide, carbon-doped silicon dioxide, porous silicon dioxide, a dielectric material having a low dielectric constant (low-K), a dielectric material having an ultra-low dielectric constant (ULK), a dielectric material having a dielectric constant substantially less than a dielectric constant of silicon dioxide, or a dielectric material having a dielectric constant substantially less than 4.

In some embodiments, the conductive members 102b and the conductive vias 102c are configured to electrically connect to the via 101c or the first conductive bump 101e. In some embodiments, the conductive members 102b and the conductive vias 102c are electrically connected to a circuitry disposed over or within the substrate 101. In some embodiments, the conductive members 102b are electrically coupled to the corresponding conductive vias 102c. In some embodiments, the conductive members 102b are conductive lines and laterally extend within the dielectric layer 102a-1, 102a-2 or 102a-3, and the conductive vias 102c vertically extend within the dielectric layer 102a-2 or 102a-3 to interconnect overlying and underlying conductive members 102b. In some embodiments, the conductive members 102b and the conductive vias 102c include conductive material such as gold, silver, copper, nickel, tungsten, aluminum, tin, an alloy thereof, or the like.

In some embodiments, the conductive members 102b include a first conductive member 102b-1 and a second conductive member 102b-2. The conductive members 102b-1 and 102b-2 may be in a shape of a disc, line, strip, polygon or the like. In some embodiments, the first conductive member 102b-1 and the second conductive member 102b-2 are formed or disposed over the third layer 102a-3 of the dielectric layer 102a. In some embodiments, the first conductive member 102b-1 and the second conductive member 102b-2 are formed adjacent to each other. In some embodiments, the first conductive member 102b-1 and the second conductive member 102b-2 are separated by a dielectric material. In some embodiments, the first conductive member 102b-1 is horizontally aligned with the second conductive member 102b-2. In some embodiments, the first conductive member 102b-1 and the second conductive member 102b-2 are electrically connected to the corresponding conductive vias 102c. In some embodiments, the vias 101c are electrically connected to the first conductive member 102b-1, the second conductive member 102b-2, the third conducive member 102b-3 or the fourth conductive member 102b-4 through the conductive vias 102c.

In some embodiments, the first conductive member 102b-1 is configured to convert an electrical signal to an electromagnetic signal or convert an electromagnetic signal to an electrical signal. In some embodiments, the first conductive member 102b-1 is configured to transmit the electromagnetic signal to the second conductive member 102b-2 or receive the electromagnetic signal from the second conductive member 102b-2. In some embodiments, the second conductive member 102b-2 is configured to receive the electromagnetic signal from the first conductive member 102b-1 or transmit the electromagnetic signal to the first conductive member 102b-1. In some embodiments, the second conductive member 102b-2 is configured to convert the electromagnetic signal to an electrical signal or convert an electrical signal to an electromagnetic signal. In some embodiments, the electromagnetic signal is radiation of a non-visible wavelength, such as microwave, radio wave, millimeter wave, or the like. In some embodiments, the electromagnetic signal is a non-visible light.

In some embodiments, the conductive members 102b include a third conductive member 102b-3 and a fourth conductive member 102b-4. The conductive members 102b-3 and 102b-4 may be in a shape of a disc, line, strip, polygon or the like. In some embodiments, the third conductive member 102b-3 and the fourth conductive member 102b-4 are disposed or formed within the second layer 102a-2 of the dielectric layer 102a. In some embodiments, the third conductive member 102b-3 and the fourth conductive member 102b-4 are formed adjacent to each other. In some embodiments, the third conductive member 102b-3 is horizontally aligned with the fourth conductive member 102b-4. In some embodiments, the third conductive member 102b-3 and the fourth conductive member 102b-4 are electrically connected to corresponding conductive vias 102c.

In some embodiments, the third conductive member 102b-3 is configured to convert an electrical signal to an electromagnetic signal or convert an electromagnetic signal to an electrical signal. In some embodiments, the third conductive member 102b-3 is configured to transmit the electromagnetic signal to the second conductive member 102b-2 or the fourth conductive member 102b-4, or receive the electromagnetic signal from the second conductive member 102b-2 or the fourth conductive member 102b-4. In some embodiments, the fourth conductive member 102b-4 is configured to convert the electromagnetic signal to an electrical signal or convert an electrical signal to an electromagnetic signal. In some embodiments, the fourth conductive member 102b-4 is configured to receive the electromagnetic signal from the first conductive member 102b-1 or the third conductive member 102b-3, or transmit the electromagnetic signal to the first conductive member 102b-1 or the third conductive member 102b-3.

In some other embodiments, the first conductive member 102b-1 and the third conductive member 102b-3 are disposed on a same side of the waveguide 103, e.g., as described with reference to FIG. 3B. Similarly, in some other embodiments, the second conductive member 102b-2 and the fourth conductive member 102b-4 are disposed on a same side of the waveguide 103.

In some embodiments, the first conductive member 102b-1 and the second conductive member 102b-2 are configured respectively as a first transmission electrode and a first receiving electrode, or are configured respectively as a first receiving electrode and a first transmission electrode. In some embodiments, the third conductive member 102b-3 and the fourth conductive member 102b-4 are configured respectively as a second transmission electrode and a second receiving electrode, or are configured respectively as a second receiving electrode and a second transmission electrode. In some embodiments, the third conductive member 102b-3 is disposed on a side of the waveguide 103 opposite to the first conductive member 102b-1, and the fourth conductive member 102b-4 is disposed on a side of the waveguide 103 opposite to the second conductive member 102b-2. In some embodiments, the first conductive member 102b-1 has a configuration similar to the configuration of the third conductive member 102b-3, and the second conductive member 102b-2 has a configuration similar to that of the fourth conductive member 102b-4.

In some embodiments, the first conductive member 102b-1 and the third conductive member 102b-3 are operable in pairs, in which one of the pair serves as a signal terminal to transmit or receive the electromagnetic signal and the other is grounded. In some embodiments, the second conductive member 102b-2 and the fourth conductive member 102b-4 are operable in pairs, in which one of the pair serves as a signal terminal to transmit or receive the electromagnetic signal and the other is grounded.

In some embodiments, the waveguide 103 is disposed within the third layer 102a-3 of the dielectric layer 102a in the interconnect structure 102. In some embodiments, the waveguide 103 is disposed between two of the conductive members 102b. In some embodiments, the waveguide 103 is disposed between the first conductive member 102b-1 and the second conductive member 102b-2 or between the third conductive member 102b-3 and the fourth conductive member 102b-4. In some embodiments, the waveguide 103 is coupled to the first conductive member 102b-1 and the second conductive member 102b-2. In some embodiments, the waveguide 103 is coupled to the third conductive member 102b-3 and the fourth conductive member 102b-4.

In some embodiments, the waveguide 103 includes a first end 103a and a second end 103b opposite to the first end 103a. In some embodiments, the first end 103a is coupled to the first conductive member 102b-1 or the third conductive member 102b-3, and the second end 103b is coupled to the second conductive member 102b-2 or the fourth conductive member 102b-4. In some embodiments, the first end 103a is surrounded by the first conductive member 102b-1 and the third conductive member 102b-3, and the second end 103b is surrounded by the second conductive member 102b-2 and the fourth conductive member 102b-4.

In some embodiments, the waveguide 103 is dielectric and configured to transmit an electromagnetic signal from one of the conductive members 102b to another one of the conductive members 102b. In some embodiments, the electromagnetic signal is transmitted within the waveguide 103. In some embodiments, the waveguide 103 is configured to transmit an electromagnetic signal from the first conductive member 102b-1 to the second conductive member 102b-2, or from the third conductive member 102b-3 to the fourth conductive member 102b-4, through the waveguide 103.

In some embodiments, the first conductive member 102b-1 and the third conductive member 102b-3 are configured as a pair of antenna plates configured to transmit or receive the electromagnetic signal, in which one of the antenna plates serves as a signal port and the other is grounded. Similarly, the second conductive member 102b-2 and the fourth conductive member 102b-4 are configured as a pair of antenna plates configured to transmit or receive the electromagnetic signal, in which one of the antenna plates serves as a signal port and the other is grounded. In some embodiments, at least a portion of the waveguide 103, such as the first end 103a, between the first conductive member 102b-1 and the third conductive member 102b-3 is formed as a resonant cavity and conducts conversion between the electromagnetic signal and an electrical signal in conjunction with the first conductive member 102b-1 and the third conductive member 102b-3. In some embodiments, standing waves of the electromagnetic radiation are formed within the waveguide 103 in which the resonating frequencies of the standing waves are determined by the geometry of the waveguide 103, such as the width and height of the waveguide 103. In some embodiments, at least a portion of the waveguide 103, such as the second end 103b, between the second conductive member 102b-2 and the fourth conductive member 102b-4 is formed as a resonant cavity and conducts conversion between the electromagnetic signal and an electrical signal in conjunction with the second conductive member 102b-2 and the fourth conductive member 102b-4.

In some embodiments, an electrical signal from the first conductive member 102b-1 is converted to an electromagnetic signal, the electromagnetic signal is transmitted within the waveguide 103 from the first end 103a to the second end 103b, and the electromagnetic signal is converted to an electrical signal at the second conductive member 102b-2. As such, the electrical signal is transmitted from the first conductive member 102b-1 to the second conductive member 102b-2 through the waveguide 103. In some embodiments, a transmission speed of the electromagnetic signal is substantially greater than 10 or 100 gigabits per second (Gbps). The electrical signal transmitted from the second conductive member 102b-2 to the first conductive member 102b-1 is conducted in a similar way.

In some embodiments, the waveguide 103 has a shape of a slab, a prism, a cuboid, a disc, a board, a slice or another suitable form. In some embodiments, the waveguide 103 laterally extends within the dielectric layer 102a-3. In some embodiments, a height of the waveguide 103 is between about 1 μm and about 20 μm. In some embodiments, a width of the waveguide 103 is between about 10 μm and about 200 μm. In some embodiments, the width of the waveguide 103 is about 10 times the height of the waveguide 103. In some embodiments, the length of the waveguide 103 is between about 0.01 cm and about 1 cm.

In some embodiments, a dielectric constant of the waveguide 103 is substantially greater than the dielectric constant of the dielectric layer 102a, e.g., the first layer 102a-1, the second layer 102a-2 or the third layer 102a-3. In some embodiments, a dielectric constant of the waveguide 103 is at least ten times the dielectric constant of the dielectric layer 102a. Since the dielectric constant of the waveguide 103 is substantially greater than the dielectric constant of the dielectric layer 102a, the waveguide 103 causes the electromagnetic signal entering the waveguide 103 to be reflected within the waveguide 103 by total internal reflection, such that the electromagnetic signal can be transmitted between the first end 103a and the second end 103b of the waveguide 103 or between the first conductive member 102b-1 and the second conductive member 102b-2.

In some embodiments, the dielectric constant of the waveguide 103 is substantially greater than a dielectric constant of silicon dioxide. In some embodiments, the dielectric constant of the waveguide 103 is substantially greater than 4. In some embodiments, the dielectric constant of the waveguide 103 is substantially greater than 7. In some embodiments, the dielectric constant of the waveguide 103 is substantially greater than 13. In some embodiments, the dielectric constant of the waveguide 103 is substantially greater than 100. In some embodiments, the dielectric constant of the waveguide 103 is substantially greater than 200. In some embodiments, the dielectric constant of the waveguide 103 is substantially greater than 500.

In some embodiments, the waveguide 103 includes silicon nitride or silicon carbide. In some other embodiments, the waveguide 103 includes silicon dioxide ($CVD-SiO_2$), silicon nitride (SiNx) or silicon oxynitride (SiOxNy) deposited by any suitable deposition method, such as chemical vapor deposition (CVD), plasma-enhanced CVD (PECVD), sub-atmospheric CVD (SACVD), atmospheric pressure CVD (APCVD), metal organic CVD (MOCVD), laser CVD (LCVD), or the like. In some embodiments, the waveguide 103 includes low-temperature titanium dioxide ($TiO_2$) deposited by LCVD, physical vapor deposition (PVD), electron beam (e.g., electronic gun) evaporation, or the like. In some embodiments, the waveguide 103 includes low-temperature high-k dielectric material such as zirconium dioxide ($ZrO_2$), aluminum oxide ($Al_2O_3$), hafnium oxide (HfOx), hafnium silicate (HfSiOx), zirconium titanate (ZrTiOx), tantalum oxide (TaOx), or the like. In some embodiments, the waveguide 103 includes strontium titanate ($SrTiO_3$ having dielectric constant (k) of about 83 to about 100) or barium titanate ($BaTiO_3$ having dielectric constant (k) of about 500). In some embodiments, the waveguide 103 includes a dielectric constant higher than a dielectric constant of aluminum oxide ($Al_2O_3$), e.g., about 9.

In some embodiments, the dielectric material for the waveguide 103 mentioned above is fabricated using a low-temperature deposition process using CVD, PVD, or other deposition operations. In some embodiments, the low-temperature deposition process is performed at a temperature less than about 400° C. In some embodiments, the low-temperature deposition process is performed at a temperature less than about 300° C. In some embodiments, the low-temperature deposition process is performed at a temperature less than about 250° C. For example, the silicon dioxide is formed using CVD at about 180° C., the titanium dioxide may be formed using PVD at about 240° C., and the high-k dielectric material may be formed using CVD at about 210° C. The waveguide 103 manufactured using the deposition-based operations can share the tools and processes used for other parts of the semiconductor structure 100, to thereby save time and cost. In some embodiments, the operation temperature of forming the waveguide 103 is similar to the operation temperature of forming other parts of the semiconductor structure 100, such as the components of the interconnect structure 102.

In some embodiments, the dielectric material for the waveguide 103 mentioned above is formed using a high-temperature operation, such as powder metallurgy. For example, the titanium dioxide may be formed using powder metallurgy at a temperature greater than about 400° C., greater than about 600° C., greater than about 800° C., or greater than about 1000° C. In some embodiments, the waveguide 103 manufactured using the non-deposition-based operation (e.g., metallurgy) does not share the tools and processes with other parts of the semiconductor structure 100 due to different process temperature requirements, and may be prepared or manufactured before being disposed in the semiconductor structure 100. The waveguide 103 manufactured using the metallurgy-based operation can be made, e.g., to have a dielectric constant (k) greater than about 50, greater than about 100, greater than about 500, or greater than about 1000, that is, greater than the dielectric constant of the waveguide 103 made using a deposition-based operation. As a result, the transmission bandwidth and data transfer rate of the waveguide 103 can be increased and the required thickness of the waveguide 103 can be further decreased.

In some embodiments, the conductive members 102b further include one or more fifth conductive members 102b-5. The fifth conductive members 102b-5 may be disposed or fabricated between the vias 101c and the third conductive member 102b-3 or between the vias 101c and the fourth conductive member 102b-4. In some embodiments, the fifth conductive members 102b-5 may be disposed or fabricated between the first surface 101a of the substrate 101 and the third conductive member 102b-3 or the fourth conductive member 102b-4. In some embodiments, the fifth conductive members 102b-5 are formed on the side of the third conductive member 102b-3 or the fourth conductive member 102b-4 opposite to the waveguide 103. In some embodiments, the fifth conductive members 102b-5 are grounded or electrically connected to a ground terminal and configured to provide, to the waveguide 103, electrical shielding from external noise and interference. In some embodiments, the fifth conductive member 102b-5 is in a shape of a disc or slab extending horizontally and overlapping the entire waveguide 103, the first conductive member 102b-1, the second conductive member 102b-2, the third conductive member 102b-3 and the fourth conductive member 102b-4. In some embodiments, the fifth conductive members 102b-5 are in a rectangular shape, in which the fifth conductive members 102b-5 are spaced apart from and parallel to each other, and extend in a same direction, e.g., perpendicular to the direction in which the waveguide 103 extends.

In some embodiments, the first die 104 is disposed over the interconnect structure 102. In some embodiments, the first die 104 is disposed over the first conductive member 102b-1 or the third conductive member 102b-3. In some embodiments, the first die 104 is fabricated with a predetermined functional circuit within the first die 104. In some embodiments, the first die 104 is singulated from a semiconductive wafer by a mechanical or laser blade. In some embodiments, the singulated first die 104 is electrically connected to the first conductive member 102b-1 or the third conductive member 102b-3.

In some embodiments, the second die 105 is disposed over the interconnect structure 102. In some embodiments, the second die 105 is disposed adjacent to the first die 104. In some embodiments, the second die 105 is disposed over the second conductive member 102b-2 or the fourth conductive member 102b-4. In some embodiments, the second die 105 is fabricated with a predetermined functional circuit within the second die 105. In some embodiments, the second die 105 is singulated from a semiconductive wafer by a mechanical or laser blade. In some embodiments, the singulated second die 105 is electrically connected to the second conductive member 102b-2 or the fourth conductive member 102b-4.

In some embodiments, the first die 104 or the second die 105 comprises a variety of electrical circuits suitable for a particular application. The electrical circuits may include various devices such as transistors, capacitors, resistors, diodes or the like. In some embodiments, the electrical circuits include an oscillator configured to generate high-bandwidth electrical signals for transmission through the waveguide 103. In some embodiments, the electrical circuits include transistors (not shown in FIG. 1 but illustrated as the circuits 301 and 305 in FIG. 3A, and the circuits 311 and 315 in FIG. 3B) electrically connected to the waveguide 103 and used for configuring the transmission and reception of the electromagnetic signal.

In some embodiments, the first die 104 or the second die 105 is a die, a chip or a package. In some embodiments, the first die 104 or the second die 105 is a logic device die, a central processing unit (CPU) die, a graphics processing unit (GPU) die, a mobile phone application processing (AP) die, a system on chip (SoC) that integrates multiple electronic components into a single die, or a high bandwidth memory (HBM) die. In the depicted example, the first die 104 is a CPU die while the second die 105 is an HBM die. In some embodiments, the first die 104 or the second die 105 is in a quadrilateral, a rectangular or a square shape from a top-view perspective.

The second die 105 may be operable in pairs with the first die 104. In some embodiments, the first die 104 is a transmitter die or a driver die and the second die 105 is a receiving die or a receiver die. In some other embodiments, the second die 105 is a transmitter die or a driver die and the first die 104 is a receiving die or a receiver die. In some embodiments, the transmitter die includes a transmitter circuit configured to generate an electrical signal. In some embodiments, the receiving die includes a receiving circuit configured to receive the electrical signal. In some embodiments, the electrical signal generated by the first die 104 (or the second die 105) is converted to an electromagnetic signal, and the electromagnetic signal is transmitted from the first die 104 (or the second die 105) through the waveguide 103 to the second conductive member 102b-2 (or the first conductive member 102b-1) or the fourth conductive member 102b-4 (or the third conductive member 102b-3), and the electromagnetic signal is converted to an electrical signal received by the second die 105 (or the first die 104), such that the electrical signal from the first die 104 (or the second die 105) is transmitted to the second die 105 (or the first die 104) through the waveguide 103.

In some embodiments, the first die 104 is electrically connected to the first conductive member 102b-1 or the third conductive member 102b-3 through a redistribution layer (RDL) 106 and a second conductive bump 107. In some embodiments, the RDL 106 is disposed or formed over the interconnect structure 102. In some embodiments, the RDL 106 is configured to re-route a path of circuitry from the first die 104 to the conductive members 102b, so as to redistribute I/O terminals of the first die 104. In some embodiments, the RDL 106 serves as a topmost layer of the interconnect structure 102.

In some embodiments, the RDL 106 includes a second dielectric layer 106a and a second pad 106b. In some embodiments, the second dielectric layer 106a is disposed or deposited over the third layer 102a-3 of the dielectric layer 102a, and the second dielectric layer 106a may also be referred to as a fourth layer 102a-4 of the dielectric layer 102a. In some embodiments, the second pad 106b is partially exposed through the second dielectric layer 106a. In some embodiments, the second pad 106b is electrically connected to the conductive via 102c or the conductive members 102b. In some embodiments, the second pad 106b extends into the second dielectric layer 106a.

In some embodiments, a portion of the second pad 106b is surrounded by the second dielectric layer 106a. In some embodiments, the second dielectric layer 106a includes dielectric material such as silicon oxide, silicon nitride, silicon carbide, silicon oxynitride or the like. In some embodiments, the second pad 106b includes conductive material such as gold, silver, copper, nickel, tungsten, aluminum, palladium and/or alloys thereof.

In some embodiments, one or more second conductive bumps 107 are disposed or fabricated between the interconnect structure 102 and the first die 104. In some embodiments, the second conductive bumps 107 are disposed between the RDL 106 and the first die 104. In some embodiments, the first die 104 is electrically connected to the conductive members 102b or the second pads 106b through the second conductive bumps 107. In some embodiments, the second conductive bump 107 is in a cylindrical, spherical or hemispherical shape. In some embodiments, the second conductive bump 107 is a solder joint, a solder bump, a solder ball, a ball grid array (BGA) ball, a controlled collapse chip connection (C4) bump or the like. In some embodiments, the second conductive bump 107 is a conductive pillar or post. In some embodiments, the second conductive bump 107 includes metals such as lead, tin, copper, gold, nickel, or the like.

In some embodiments, the second die 105 is electrically connected to the second conductive member 102b-2 or the fourth conductive member 102b-4 through the redistribution layer (RDL) 106 and the second conductive bumps 107. In some embodiments, the second die 105 is electrically connected to the second pads 106b of the RDL 106 through the second conductive bumps 107. In some embodiments, the second conductive bumps 107 are disposed between the interconnect structure 102 and the second die 105. In some embodiments, the second conductive bumps 107 are disposed between the RDL 106 and the second die 105. In some embodiments, the second die 105 is disposed over the second conductive member 102b-2.

In some embodiments, an underfill material 108 is disposed or dispensed over the RDL 106, the interconnect structure 102 and the substrate 101. In some embodiments, the underfill material 108 surrounds the second conductive bump 107. In some embodiments, the underfill material 108 fills space between two adjacent second conductive bumps 107. In some embodiments, a sidewall of the first die 104 or a sidewall of the second die 105 is in contact with the underfill material 108. In some embodiments, the underfill material 108 is an electrically insulated adhesive for protecting the second conductive bump 107 or securing a bonding between the first die 104 and the RDL 106 or between the second die 105 and the RDL 106. In some embodiments, the underfill material 108 includes epoxy, resin, epoxy molding compounds or the like.

In some embodiments, a molding compound 109 is disposed over the RDL 106, the interconnect structure 102 and the substrate 101. In some embodiments, the molding compound 109 surrounds the first die 104 and the second die 105. In some embodiments, the molding compound 109 covers the underfill material 108. In some embodiments, a portion of the molding compound 109 is disposed between the first die 104 and the second die 105. In some embodiments, the portion of the molding compound 109 is disposed over the waveguide 103. In some embodiments, a surface of the first die 104 or a surface of the second die 105 is exposed through the molding compound 109. In some embodiments, the molding compound 109 is in contact with the sidewall of the first die 104 or the sidewall of the second die 105. In some embodiments, the molding compound 109 can be a single-layer film or a composite stack. In some embodiments, the molding compound 109 includes various dielectric materials, such as molding underfill, epoxy, resin, or the like. In some embodiments, the molding compound 109 has a high thermal conductivity, a low moisture absorption rate and a high flexural strength.

Figure 2:
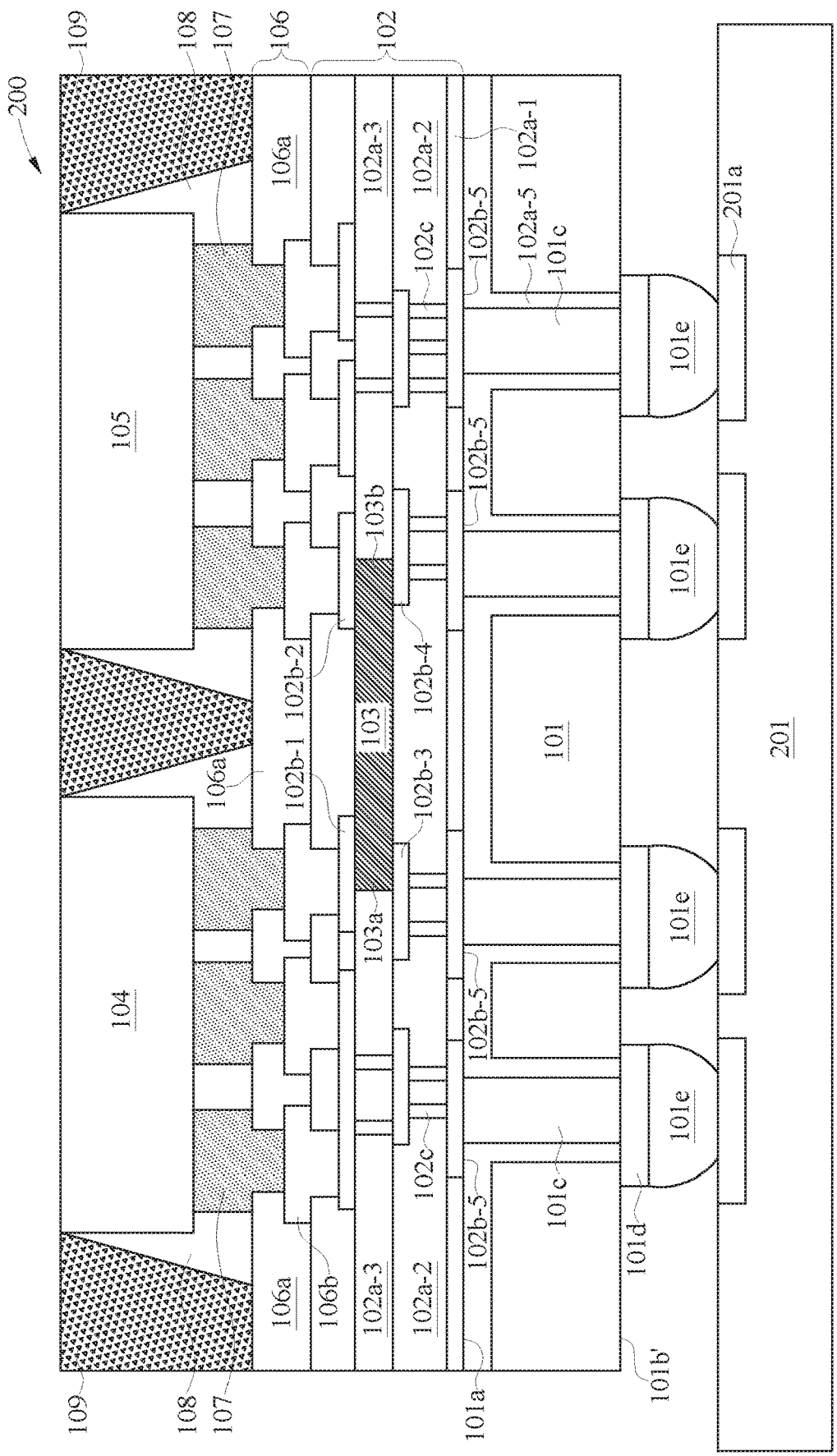
FIG. 2 is a schematic cross-sectional view of a semiconductor structure, in accordance with some embodiments of the present disclosure.

FIG. 2 is a schematic cross-sectional view of semiconductor structure 200 in accordance with various embodiments of the present disclosure. In some embodiments, the semiconductor structure 200 includes a substrate 101, an interconnect structure 102, a waveguide 103, a first die 104 and a second die 105, which have configurations similar to configurations of similar components described above or illustrated in FIG. 1. In some embodiments, the via 101c is further laterally surrounded by the dielectric layer 102a, e.g., a fifth layer 102a-5 of the dielectric layer 102. In some embodiments, the fifth layer 102a-5 of the dielectric layer 102a is disposed or deposited between the via 101c and the substrate 101. In some embodiments, the configuration, material and forming method of the fifth layer 102a-5 are similar to those of the other layers of the dielectric layer 102a, and repeated descriptions thereof are omitted for brevity.

In some embodiments, the semiconductor structure 200 includes a second substrate 201 and a bond pad 201a disposed or formed over the second substrate 201. In some embodiments, the substrate 101 is disposed over the second substrate 201. In some embodiments, the first conductive bump 101e is disposed or fabricated over the bond pad 201a. In some embodiments, the bond pad 201a is electrically coupled to the first conductive bump 101e. In some embodiments, the first die 104 and the second die 105 are electrically connected to the second substrate 201 through the first conductive bump 101e.

In some embodiments, the second substrate 201 is fabricated with a predetermined functional circuit thereon. In some embodiments, the second substrate 201 includes conductive traces and electrical components, such as transistors, capacitors and diodes, disposed within the second substrate 201. In some embodiments, the second substrate 201 includes semiconductive materials such as silicon. In some embodiments, the second substrate 201 is a silicon substrate. In some embodiments, the second substrate 201 is a printed circuit board (PCB). In some embodiments, the bond pad 201a includes conductive material such as gold, silver, copper, nickel, tungsten, aluminum, palladium and/or alloys thereof.

Figure 3A:
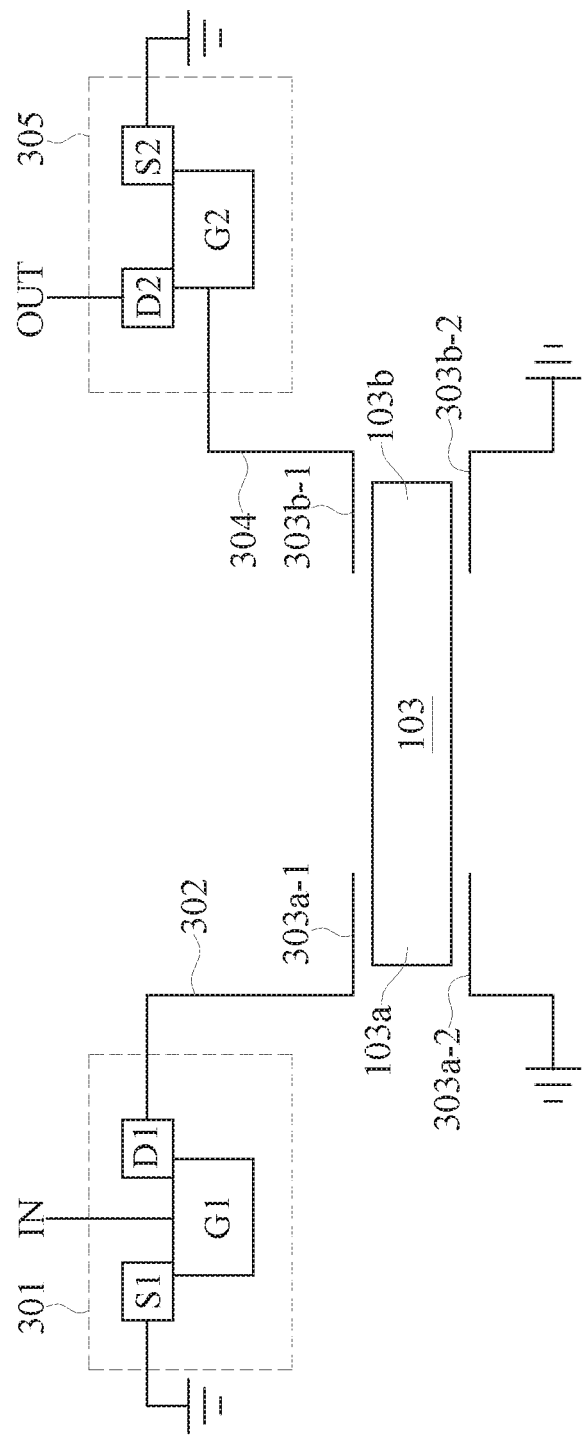
FIG. 3A is a schematic diagram illustrating a transmission circuit, a receiving circuit and a waveguide, in accordance with some embodiments of the present disclosure.

FIG. 3A is a schematic diagram of a portion of the semiconductor structure 100 in accordance with some embodiments of the present disclosure. In some embodiments, the semiconductor structure 100 includes a first circuit 301 and a second circuit 305. In some embodiments, the first circuit 301 is a transmission circuit disposed in the first die 104, and the second circuit 305 is a receiving circuit disposed in the second die 105. Alternatively, in some embodiments, the second circuit 305 is a transmission circuit disposed in the second die 105, and the first circuit 301 is a receiving circuit disposed in the first die 104. In some embodiments, the waveguide 103 is a four-port waveguide connected to the first circuit 301 and the second circuit 305.

In some embodiments, the transmission circuit 301 is a driver circuit. In some embodiments, the transmission circuit 301 is a transistor and includes a first source terminal S1, a first drain terminal D1 and a first gate terminal G1. In some embodiments, the first source terminal S1 is electrically grounded. In some embodiments, the transmission circuit 301 is configured to receive an input signal IN to the first gate terminal G1 and output an electrical signal from the first drain terminal D1 to a transmission coupling element 303a through a transmission line 302. In some embodiments, the transmission coupling element 303a includes a first transmission coupling element 303a-1 and a second transmission coupling element 303a-2. In some embodiments, the transmission coupling element 303a includes a conductive material such as gold, silver, copper, nickel, tungsten, aluminum, palladium and/or alloys thereof. In some embodiments, the first transmission coupling element 303a-1 and the second transmission coupling element 303a-2 are disposed opposite to each other. In some embodiments, the transmission coupling elements 303a-1 and 303a-2 correspond to the first conductive member 102b-1 and the third conductive member 102b-3, respectively, in FIG. 1. In some embodiments, the transmission coupling elements 303a-1 and 303a-2 correspond to the third conductive member 102b-3 and the first conductive member 102b-1, respectively, in FIG. 1. In some embodiments, one of the first transmission coupling element 303a-1 and the second transmission coupling element 303a-2 is configured to receive the electrical signal while the other is electrically grounded. In some embodiments, the first end 103a of the waveguide 103 is surrounded by the transmission coupling elements 303a. In some embodiments, the electrical signal transmitted from the transmission line 302 to the first transmission coupling element 303a-1 generates an electromagnetic signal corresponding to the electrical signal, and the electromagnetic signal is transmitted from the first end 103a to the second end 103b of the waveguide 103.

In some embodiments, the receiving circuit 305 is a receiver circuit. In some embodiments, the receiving circuit 305 is a transistor and includes a second source terminal S2, a second drain terminal D2 and a second gate terminal G2. In some embodiments, the second source terminal S2 is electrically grounded. In some embodiments, the receiving circuit 305 is configured to receive, at the second gate terminal G2, the electrical signal from a receiving coupling element 303b; the receiving circuit 305 is further configured to provide an output signal OUT at the second drain terminal D2. In some embodiments, the receiving coupling element 303b includes a first receiving coupling element 303b-1 and a second receiving coupling element 303b-2. In some embodiments, the receiving coupling element 303b includes a conductive material such as gold, silver, copper, nickel, tungsten, aluminum, palladium and/or alloys thereof. In some embodiments, the first receiving coupling element 303b-1 and the second receiving coupling element 303b-2 are disposed opposite to each other. In some embodiments, the first receiving coupling element 303b-1 and the second receiving coupling element 303b-2 correspond to the second conductive member 102b-2 and the fourth conductive member 102b-4, respectively. In some embodiments, the first receiving coupling element 303b-1 and the second receiving coupling element 303b-2 correspond to the fourth conductive member 102b-4 and the second conductive member 102b-2, respectively In some embodiments, one of the first receiving coupling element 303b-1 and the second receiving coupling element 303b-2 is configured to output the electrical signal while the other is electrically grounded. In some embodiments, the second end 103b of the waveguide 103 is surrounded by the receiving coupling element 303b. In some embodiments, the electromagnetic signal transmitted along the waveguide 103 is converted to an electrical signal at the receiving coupling element 303b, and the electrical signal is transmitted through the transmission line 304 to the second gate terminal G2.

Figure 3B:
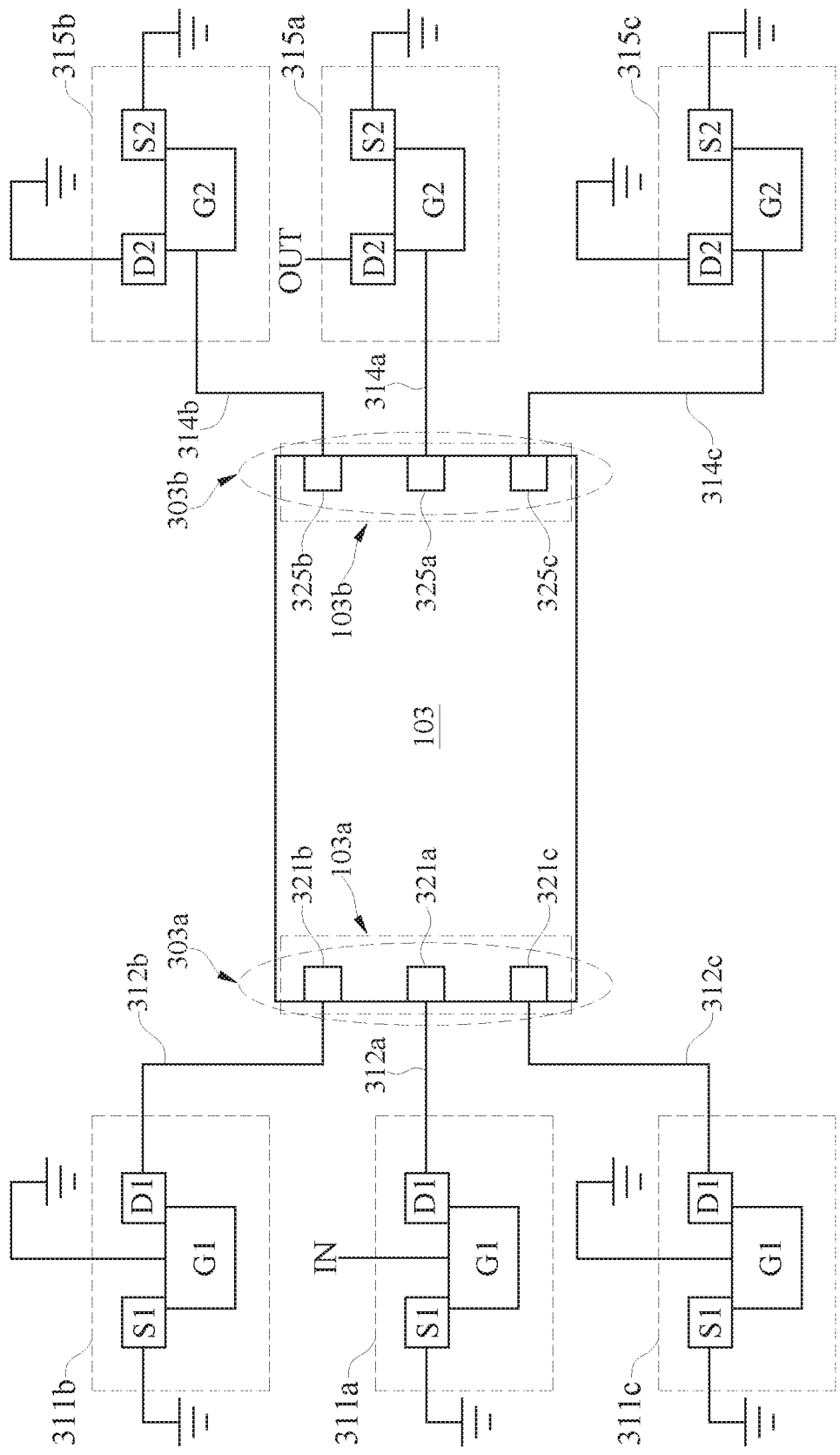
FIG. 3B is a schematic diagram illustrating a transmission circuit, a receiving circuit and a waveguide, in accordance with some embodiments of the present disclosure.

FIG. 3B is a schematic diagram of a portion of the semiconductor structure 100 in accordance with some embodiments of the present disclosure. In some embodiments, the portion of the semiconductor structure 100 shown in FIG. 3B is similar to the portion of the semiconductor structure shown in FIG. 3A except that the portion shown in FIG. 3B includes first circuits 311 (including first circuits 311a, 311b and 311c) and second circuits 315 (including second circuits 315a, 315b and 315c). In some embodiments, the first circuits 311 are transmission circuits disposed in the first die 104, and the second circuits 315 are receiving circuits disposed in the second die 105. In some embodiments, the first circuits 311 are receiving circuits disposed in the first die 104, and the second circuits 315 are transmission circuits disposed in the second die 105. In some embodiments, the waveguide 103 is a six-port waveguide including conductive members 321 and 325 coupled to the first circuits 311 and the second circuits 315. In some embodiments, the conductive members 321 and 325 include a conductive material such as gold, silver, copper, nickel, tungsten, aluminum, palladium and/or alloys thereof.

In some embodiments, the transmission circuits 311 collectively form a driver circuit. In some embodiments, each of the transmission circuits 311 is a transistor and respectively includes a first source terminal S1, a first drain terminal D1 and a first gate terminal G1. In some embodiments, the first source terminal S1 of each of the first circuits 311 is electrically grounded. In some embodiments, a transmission coupling element 303a includes conductive members 321a, 321b and 321c. In some embodiments, the transmission circuit 311a is configured to receive an input signal IN at its first gate terminal G1 and output an electrical signal from its first drain terminal D1 to the conductive member 321a through a transmission line 312a. In some embodiments, the conductive member 321b is grounded through the first drain terminal D1 and the first gate terminal G1 of the transmission circuit 311b and the transmission line 312b, and the conductive member 321c is grounded through the first drain terminal D1 and the first gate terminal G1 of the transmission circuit 311c and the transmission line 312c. In some embodiments, the conductive member 321a is included in the first conductive member 102b-1 of FIG. 1. In some embodiments, the conductive member 321b or 312c is included in the third conductive member 102b-3 of FIG. 1. In some embodiments, although not explicitly illustrated in FIG. 1, the conductive members 321a, 321b and 321c are disposed on a same side of the waveguide 103.

In some embodiments, the receiving circuits 315 collectively form a receiver circuit. In some embodiments, each of the receiving circuits 315 is a transistor and includes a second source terminal S2, a second drain terminal D2 and a second gate terminal G2. In some embodiments, the second source terminal S2 of each of the second circuits 315 is electrically grounded. In some embodiments, a receiving coupling element 303b includes conductive members 325a, 325b and 325c. In some embodiments, the conductive member 325a is configured to receive an electromagnetic signal, which is converted into an electrical signal that is provided to the second drain terminal D2 of the receiving circuit 315a through the second gate terminal G2 of the receiving circuit 315a and a transmission line 314a. In some embodiments, the conductive member 325b is grounded through the second drain terminal D2 and the second gate terminal G2 of the transmission circuit 315b and the transmission line 314b, while the conductive member 325c is grounded through the second drain terminal D2 and the second gate terminal G2 of the transmission circuit 315c and the transmission line 314c. In some embodiments, the conductive member 325a is included in the third conductive member 102b-3 of FIG. 1. In some embodiments, the conductive member 325b or 325c is included in the third conductive member 102b-3 of FIG. 1. In some embodiments, although not explicitly illustrated in FIG. 1, the conductive members 325a, 325b and 325c are disposed on a same side of the waveguide 103.

Figure 4:
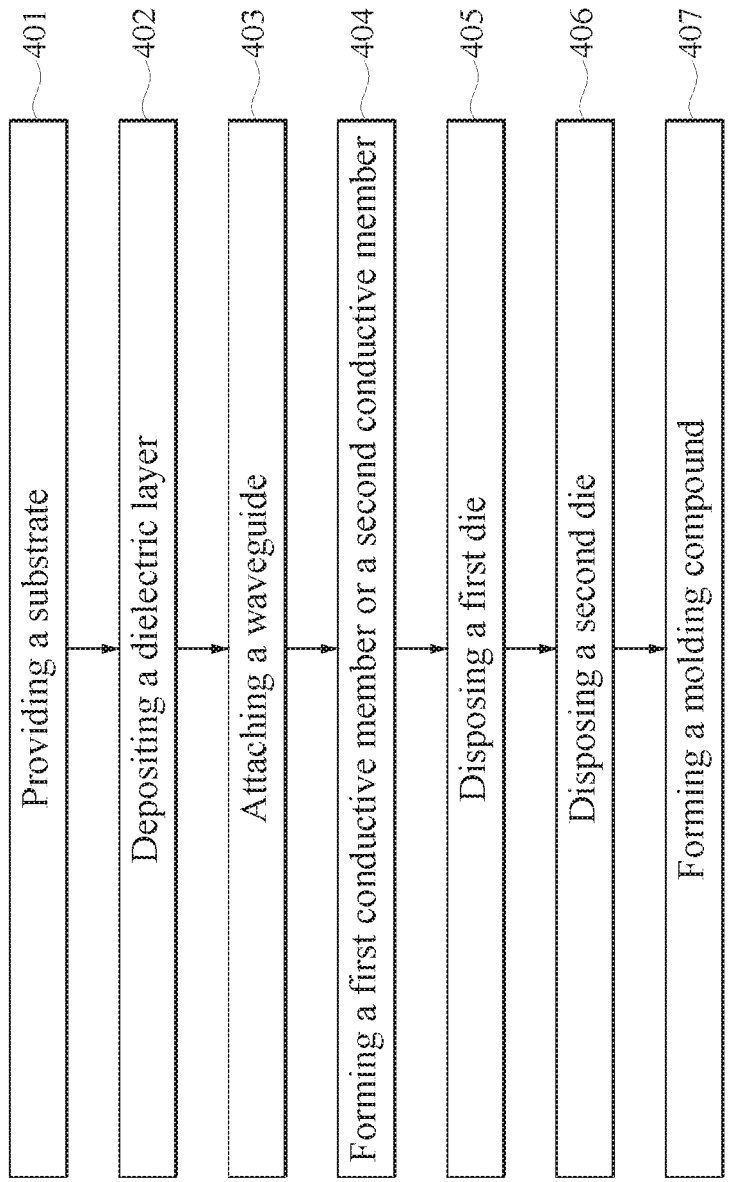
FIG. 4 is a flow diagram of a method of manufacturing a semiconductor structure, in accordance with some embodiments of the present disclosure.
Figure 4A:
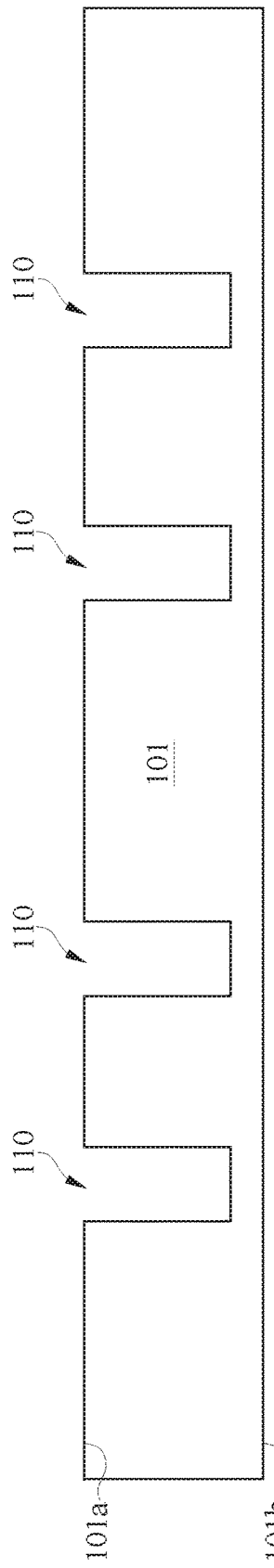
FIGS. 4A to 4P are schematic views of manufacturing a semiconductor structure by a method of FIG. 4, in accordance with some embodiments of the present disclosure.

In the present disclosure, a method of manufacturing a semiconductor structure (100 or 200) is also disclosed. In some embodiments, the semiconductor structure (100 or 200) is formed by a method 400. The method 400 includes a number of operations and the description and illustration are not deemed as a limitation as the sequence of the operations. FIG. 4 is an embodiment of the method 400 of manufacturing the semiconductor structure (100 or 200). The method 400 includes a number of operations (401, 402, 403, 404, 405, 406 and 407). The method illustrated in FIGS. 4 and 4A to 4P is exemplary. Modifications to the below-mentioned stages, such as changes of order of the stages, partition of the stages, and deletion or addition of stages, are within the contemplated scope of the present disclosure.

Figure 4B:
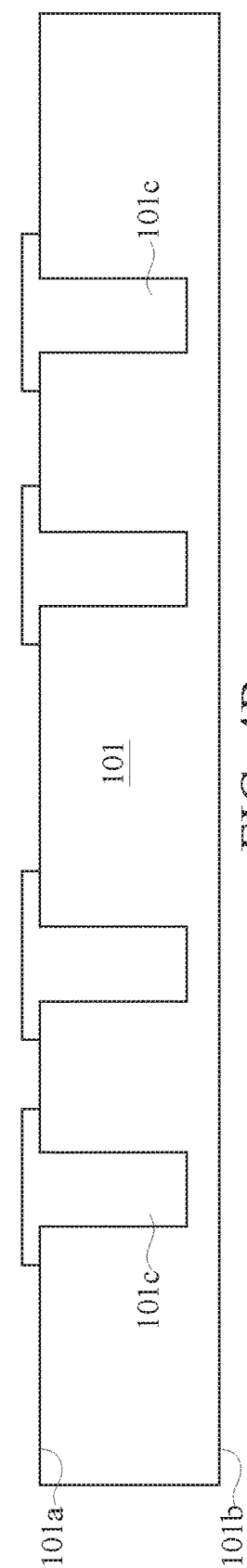

In operation 401, a substrate 101 is provided or received as shown in FIGS. 4A and 4B. In some embodiments, the substrate 101 is a semiconductive substrate. In some embodiments, the substrate 101 is a silicon substrate or a silicon interposer. In some embodiments, the substrate 101 includes a first surface 101a and a second surface 101b opposite to the first surface 101a. In some embodiments, the substrate 101 has a configuration similar to the configuration of the substrate described above or illustrated with reference to FIG. 1 or 2.

In some embodiments, a via 101c is formed so as to extend through at least a portion of the substrate 101. In some embodiments, the via 101c extends between the first surface 101a and the second surface 101b. In some embodiments, the via 101c is a through silicon via (TSV). In some embodiments, the via 101c is formed by removing a portion of the substrate 101 to form first recesses 110, as shown in FIG. 4A, and forming a conductive material in the first recesses 110 to form the vias 101c as shown in FIG. 4B. In some embodiments, the removal of the portion of the substrate 101 includes photolithography, etching or any other suitable operations. In some embodiments, the formation of the conductive material includes sputtering, electroplating or any other suitable operations. In some embodiments, the via 101c has a configuration similar to the configuration of the via 101c described above or illustrated with reference to FIG. 1 or 2. In some embodiments, a dielectric material, e.g., the fifth layer 102a-5 of the dielectric layer 102a in FIG. 2, is deposited over the substrate 101 and along a sidewall of the first recesses 110 before the formation of the conductive material into the first recess 110. In some embodiments, the dielectric material surrounds the via 101c. In some embodiments, the dielectric material is deposited between the via 101c and the substrate 101. In some embodiments, a horizontal portion of the via 101c over the substrate 101 is implemented as part of the conductive members 102b, e.g., the fifth conductive member 102b-5 shown in FIG. 1, of the interconnect structure 102.

Figure 4C:
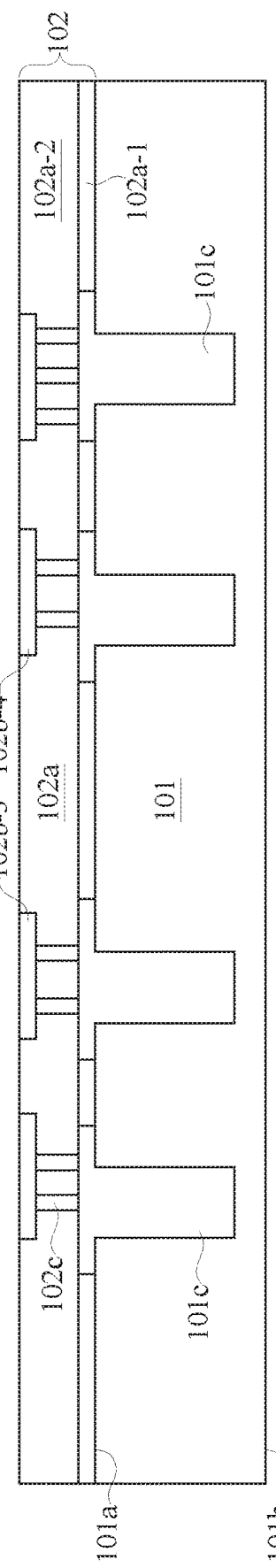

In operation 402, a first layer 102a-1 and a second layer 102a-2 of the dielectric layer 102a are deposited in succession over the substrate 101 as shown in FIG. 4C. In some embodiments, the first layer 102a-1 or the second layer 102a-2 of the dielectric layer 102a is a low dielectric constant layer. In some embodiments, the first layer 102a-1 of the dielectric layer 102a includes silicon dioxide, fluorine-doped silicon dioxide, carbon-doped silicon dioxide, porous silicon dioxide, a dielectric material having a low dielectric constant (low K), a dielectric material having an ultra-low dielectric constant (ULK), a dielectric material having a dielectric constant substantially less than a dielectric constant of silicon dioxide, or a dielectric material having a dielectric constant substantially less than 4. In some embodiments, the first layer 102a-1 or the second layer 102a-2 of the dielectric layer 102a is deposited by spin coating, chemical vapor deposition (CVD), plasma-enhanced CVD (PECVD), high-density plasma CVD (HDPCVD) or any other suitable operation. In some embodiments, a planarization operation, such as grinding, chemical mechanical planarization (CMP) or the like is performed subsequent to the formation of the first layer 102a-1 to provide a planarized surface of the first layer 102a-1, which is coplanar with an upper surface of the via 101c. The planarization operation may also be performed subsequent to the formation of the second layer 102a-2 to provide a planar surface of the second layer 102a-2.

In some embodiments, conductive vias 102c are formed subsequent to the formation of the second layer 102a-2 of the dielectric layer 102a. In some embodiments, the conductive vias 102c are formed by removing a portion of the second layer 102a-2 of the dielectric layer 102a and forming a conductive material therein. In some embodiments, the removal of the portion of the second layer 102a-2 in the dielectric layer 102a includes photolithography, etching or any other suitable operations. In some embodiments, the forming of the conductive material includes sputtering, electroplating or any other suitable operations. In some embodiments, the conductive via 102c has a configuration similar to the configuration of the conductive via described above or illustrated with reference to FIG. 1 or 2. In some embodiments, the conductive members 102b and some conductive vias 102c are formed separately or simultaneously.

In some embodiments, conductive members 102b are formed after the deposition of the conductive vias 102c. In some embodiments, conductive members 102b and conductive vias 102c are formed within the second layer 102a-2 of the dielectric layer 102a. In some embodiments, conductive members 102b including a third conductive member 102b-3 and a fourth conductive member 102b-4 are formed. In some embodiments, the conductive members 102b are formed by removing a portion of the second layer 102a-2 of the dielectric layer 102a and disposing a conductive material.

In some embodiments, the removal of the portion of the second layer 102a-2 in the dielectric layer 102a includes photolithography, etching or any other suitable operation to expose upper surfaces of the conductive vias 102c. In some embodiments, the formation of the conductive material includes sputtering, electroplating or any other suitable operation. In some embodiments, the conductive members 102b have a configuration similar to the configuration of conductive members described above or illustrated with reference to FIG. 1 or 2. In some embodiments, the etching operations for the conductive vias 102c and the conductive members 102b-3 and 102b-4 are then performed followed by a single deposition operation of the conductive material. In some embodiments, a planarization operation, such as grinding, chemical mechanical planarization (CMP) or the like is performed to remove excess materials of the conductive members 102b and provide a planarized surface of the second layer 102a-2 level with the third conductive member 102b-3 and the fourth conductive member 102b-4.

In operation 403, a waveguide 103 is attached or formed over the second layer 102a-2 of the dielectric layer 102a as shown in FIGS. 4D to 4H. In some embodiments, the waveguide 103 is formed over the conductive members 102b or the conductive vias 102c. In some embodiments, the waveguide 103 is deposited over the third conductive member 102b-3 and the fourth conductive member 102b-4. In some embodiments, the waveguide 103 is formed between the third conductive member 102b-3 and the fourth conductive member 102b-4. In some embodiments, the waveguide 103 is coupled to the third conductive member 102b-3 and the fourth conductive member 102b-4. In some embodiments, the waveguide 103 fully or partially overlaps the third conductive member 102b-3 and the fourth conductive member 102b-4.

In some embodiments, the waveguide 103 is formed by attaching a fabricated waveguide to the second layer 102a-2 of the dielectric layer 102a, as shown in FIG. 4D. In some embodiments, the waveguide 103 is fabricated in a chamber different from the chamber for fabricating the remaining parts of the semiconductor structure 100, e.g., the second layer 102a-2 and the conductive members 102b of the interconnect structure 102. In some embodiments, the fabrications of the waveguide 103 and the second layer 102a-2 of the dielectric layer 102a are performed simultaneously in separate chambers. The waveguide 103 may be formed using powder metallurgy. In some embodiments, the powder metallurgy scheme used to fabricate the waveguide 103 may involve at least one of the following operations: preparation of base powders; mixing or blending of the base powders with additives; compaction of the powders; sintering; and finishing of the compacted powders. In some embodiments, the formation of the waveguide 103 is performed at a temperature Ti higher than a predetermined temperature, e.g., about 400° C., wherein the predetermined temperature is higher than temperatures at which other parts of the semiconductor structure 100 can be fabricated with desired functionalities. In some embodiments, the temperature Ti is higher than about 600° C., higher than 800° C., or higher than about 1000° C. The fabricated waveguide 103 may be fabricated in a shape of a tile, a prism, a cuboid, a disc, a board, a pie-slice or other suitable configurations prior to attachment to the dielectric layer 102a.

In some embodiments, a pick-and-place (PNP) operation is used to attach the waveguide 103 to the semiconductor structure 100. The fabricated waveguide 103 is picked and attached to the carrier 420 by an adhesive layer 422. In some embodiments, the carrier 420 is made of glass, ceramic, silicon substrate, or other suitable materials. In some embodiments, the adhesive layer 422 includes a photosensitive material that is detachable from the carrier 420 by illuminating ultraviolet (UV) light on the carrier 420. For example, the adhesive layer 422 may be a light-to-heat-conversion (LTHC) release film, epoxy, UV glue, or the like.

After being picked and attached to the carrier 420, the waveguide 103 is moved over the second layer 102a-2 of the dielectric layer 102a and is aligned at a location, e.g., a central location between the third conductive member 102b-3 and the fourth conductive member 102b-4. A bonding tool is used to move the carrier 420 along with the waveguide 103 over the second layer 102a-2 of the dielectric layer 102a and align the waveguide 103 with the second layer 102a-2 of the dielectric layer 102a. When the waveguide 103 is aligned with the second layer 102a-2, the boding tool may cause the waveguide 103 to approach the second layer 102a-2 and engage the waveguide 103 with an upper surface of the second layer 102a-2 of the dielectric layer 102a. The waveguide 103 may be in contact with the third conductive member 102b-3 and the fourth conductive member 102b-4. The waveguide 103 may fully or partially overlap the third conductive member 102b-3 and the fourth conductive member 102b-4. In some embodiments, alignment marks may be formed on a wafer on which the semiconductor structure 100 is manufactured and on the carrier 420 for facilitating the alignment operation by the bonding tool.

FIG. 4E illustrates a thermal operation 430 on the semiconductor structure 100. The thermal operation 430 may increase strength of the bond between the waveguide 103 and the semiconductor structure 100. The thermal operation 430 may include annealing, e.g., furnace annealing or rapid thermal anneal (RTA). In some embodiments, the thermal operation 430 is performed at a temperature of about 250° C. for less than 30 minutes, such as about 10 minutes. In some embodiments, the thermal operation 430 and the bonding operation illustrated in FIG. 4D are performed in-situ.

Figure 4F:
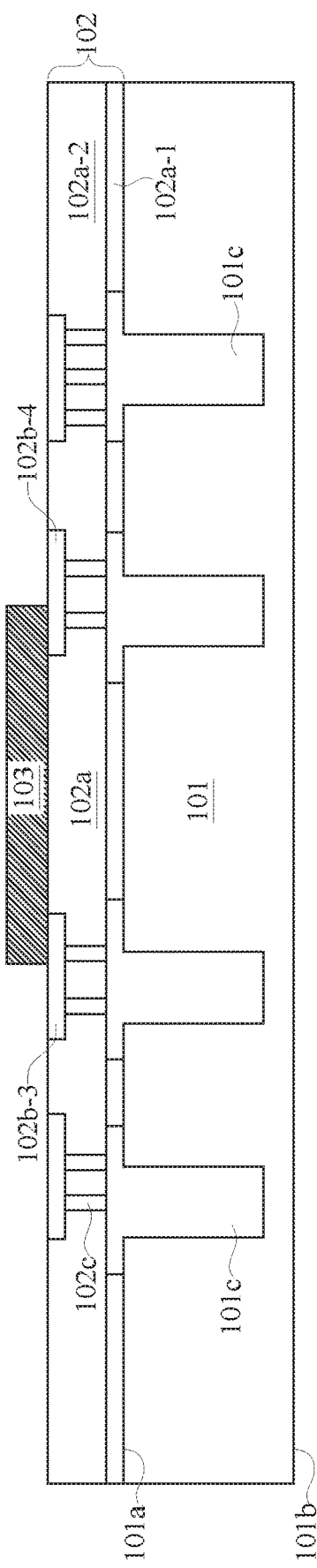
Figure 4G:
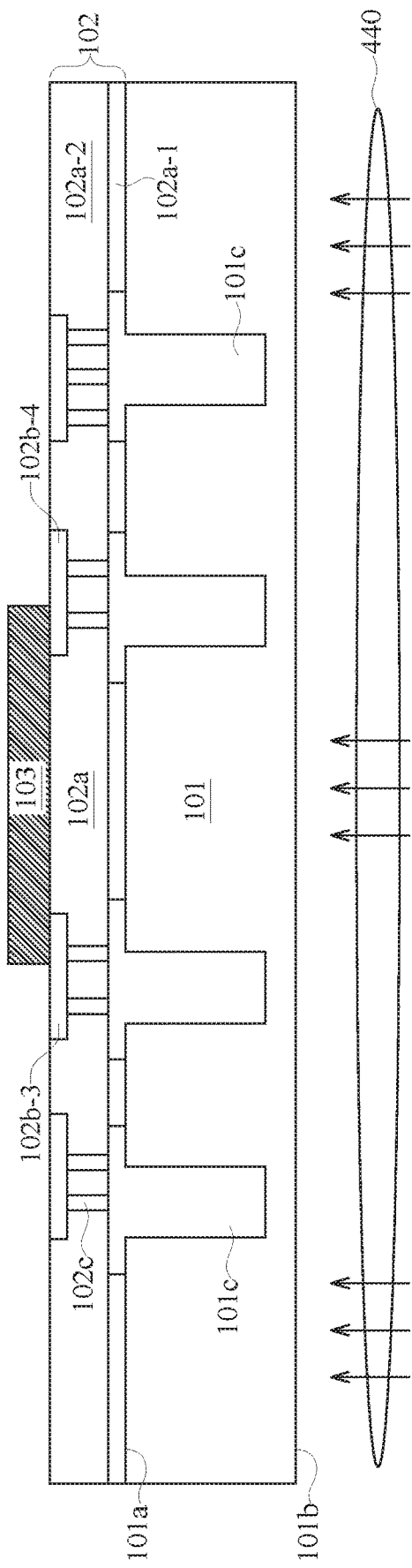

The carrier 420 is released or detached from the waveguide 103 and the semiconductor structure 100 after the waveguide 103 is bonded to the second layer 102a-2 of the dielectric layer 102, as shown in FIG. 4F. In some embodiments, the adhesion layer 422 is removed or etched during the removal of the carrier 420. FIG. 4G illustrates a thermal operation 440 on the semiconductor structure 100. The thermal operation 440 may provide greater permanent bonding strength between the waveguide 103 and the semiconductor structure 100 than that provided by the thermal operation 430. The thermal operation 440 may include annealing, e.g., furnace annealing or rapid thermal anneal (RTA). In some embodiments, the thermal operation 440 is performed at a temperature of about 250° C. for a period greater than 30 minutes, such as about 2 hours. In some embodiments, the thermal operation 440 is performed and the bonding operation illustrated in FIG. 4D are performed in-situ. In some embodiments, the waveguide 103 has a configuration similar to the configuration of the waveguide described above or illustrated in FIG. 1, 2 or 3.

Figure 4H:
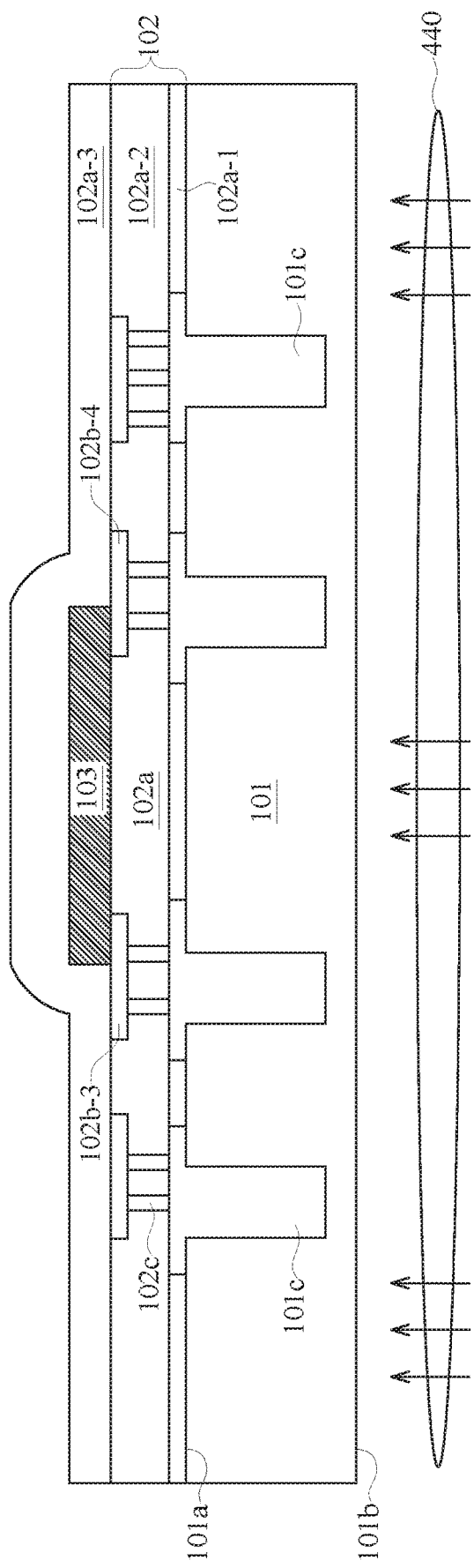
Figure 4I:
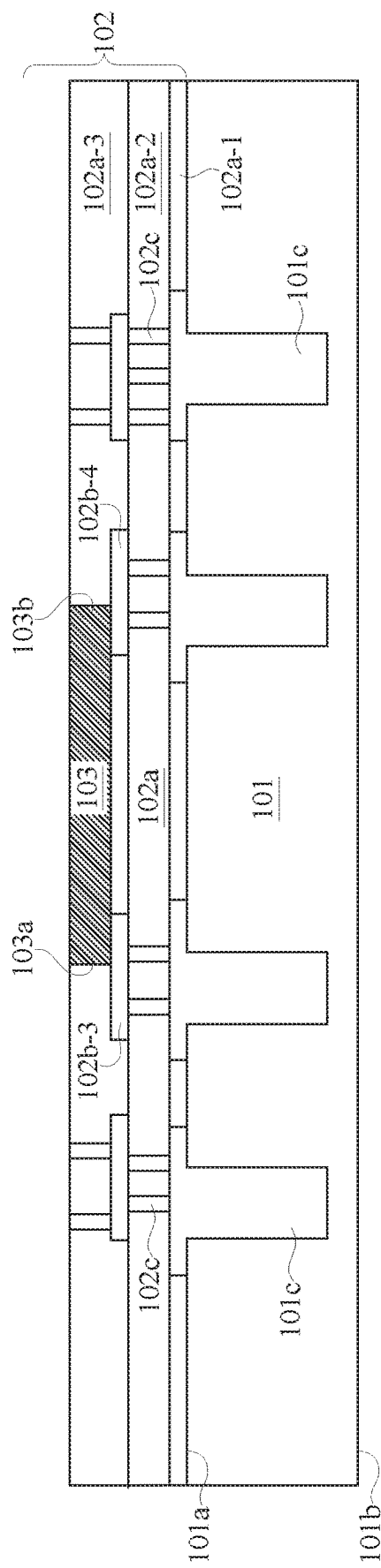

In some embodiments, a third layer 102a-3 of the dielectric layer 102a is deposited over the substrate 101 to laterally surround the waveguide 103, as shown in FIG. 4H. In some embodiments, the formation of the third layer 102a-3 of the dielectric layer 102a includes spin coating, chemical vapor deposition (CVD), plasma-enhanced CVD (PECVD), high-density plasma CVD (HDPCVD), sub-atmospheric CVD (SACVD), atmospheric pressure CVD (APCVD), metal organic CVD (MOCVD), laser CVD (LCVD), electron beam (e.g., electronic gun) evaporation or any other suitable operations. The waveguide 103 may have a dielectric constant greater than that of the third layer 102a-3 of the dielectric layer 102a. The third layer 102a-3 of the dielectric layer 102a may have a material the same as or different from that of the first layer 102a-1 or the second layer 102a-2 of the dielectric layer 102a. FIG. 4I illustrates an etching operation on the third layer 102a-3 of the dielectric layer 102a. The third layer 103a of the dielectric layer 102 is thinned to expose an upper surface of the waveguide 103. The etching operation may include a planarization such as chemical mechanical polish (CMP), dry etching, wet etching, laser etching, or any other suitable operation.

In some embodiments, conductive vias 102c are formed in the third layer 102a-3 of the dielectric layer 102a subsequent to the formation of the third layer 102a-3. In some embodiments, the conductive vias 102c are formed by removing a portion of the third layer 102a-3 of the dielectric layer 102a and forming a conductive material therein. In some embodiments, the removal of the portion of the third layer 102a-3 in the dielectric layer 102a includes photolithography, etching or any other suitable operations. In some embodiments, the forming of the conductive material includes sputtering, electroplating or any other suitable operations. In some embodiments, a planarization operation is performed to remove excess portions of the conductive material from the upper surface of the third layer 102a-3 and provide a surface of the third layer 102a-3 that is coplanar with upper surfaces of the conductive vias 102c. In some embodiments, the conductive vias 102c have a configuration similar to configuration of the conductive vias described with reference to FIG. 1 or 2.

Figure 4J:
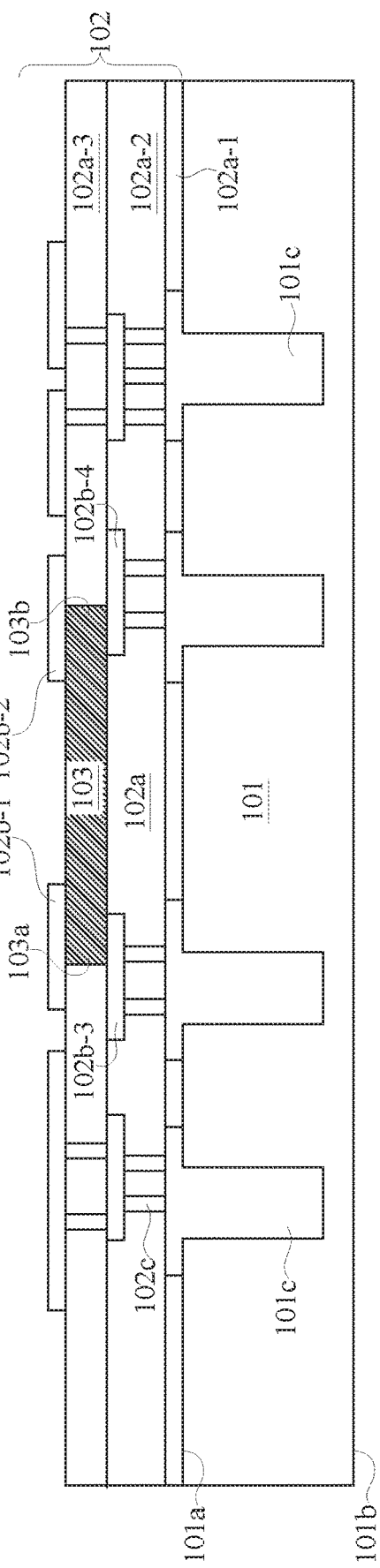

In operation 404, a first conductive member 102b-1 or a second conductive member 102b-2 is formed over the third layer 102a-3 of the dielectric layer 102a, as shown in FIG. 4J. In some embodiments, conductive members 102b including a first conductive member 102b-1 and a second conductive member 102b-2 are formed. In some embodiments, the waveguide 103 is disposed between the first conductive member 102b-1 and the second conductive member 102b-2. In some embodiments, the waveguide 103 is connected to the first conductive member 102b-1 and the second conductive member 102b-2. In some embodiments, the waveguide 103 fully or partially overlaps the first conductive member 102b-1 and the second conductive member 102b-2.

In some embodiments, the first conductive member 102b-1 or the second conductive member 102b-2 is formed on the planarized third layer 102a-3 of the dielectric layer 102a by deposition of a conductive material. In some embodiments, the disposing of the conductive material includes sputtering, electroplating or any other suitable operations. In some embodiments, the first conductive member 102b-1 and the second conductive member 102b-2 have configurations similar to those of conductive members described with reference to FIG. 1 or 2. As a result, an interconnect structure 102 including the dielectric layer 102a, the conductive members 102b and the conductive vias 102c is formed over the substrate 101. In some embodiments, the waveguide 103 is also disposed within the interconnect structure 102. In some embodiments, conductive members 102b or conductive vias 102c above the waveguide 103 are formed before or after the placement of the waveguide 103.

Figure 4K:
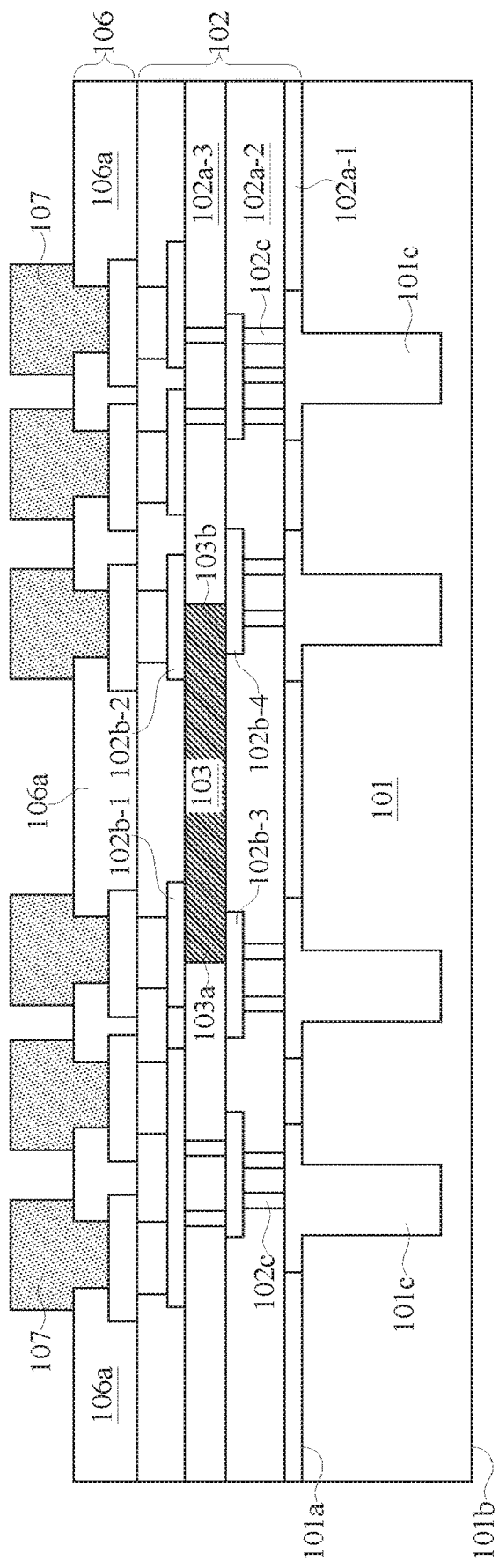

In some embodiments, after the formation of the waveguide 103, an RDL 106 is formed over the interconnect structure 102 as shown in FIG. 4K. In some embodiments, the RDL 106 including a second dielectric layer 106a and second pads 106b is formed. In some embodiments, the second pad 106b is formed over and electrically connected to the conductive member 102b. In some embodiments, the second pads 106b are formed by disposing a conductive material over the dielectric layer 102a and the conductive members 102b. In some embodiments, the second pads 106b are formed by sputtering, electroplating or any other suitable operations.

In some embodiments, the second dielectric layer 106a is disposed over the dielectric layer 102a. In some embodiments, the second dielectric layer 106a is deposited by spin coating, chemical vapor deposition (CVD), plasma-enhanced CVD (PECVD), high-density plasma CVD (HDPCVD) or any other suitable operations. In some embodiments, portions of the second dielectric layer 106a are removed to at least partially expose the second pads 106b. In some embodiments, portions of the second dielectric layer 106a are removed by photolithography, etching or any other suitable operations. In some embodiments, the second dielectric layer 106a and the second pads 106b have configurations similar to the configurations of the dielectric layer and pads described with reference to FIG. 1 or 2.

In some embodiments, one or more second conductive bumps 107 are fabricated over the second pads 106b as shown in FIG. 4K. In some embodiments, the second conductive bumps 107 are bonded to the respective second pads 106b. In some embodiments, the second conductive bumps 107 are fabricated by ball dropping, solder pasting, stencil printing or any other suitable operations. In some embodiments, the second conductive bumps 107 are reflowed after being deposited.

Figure 4L:
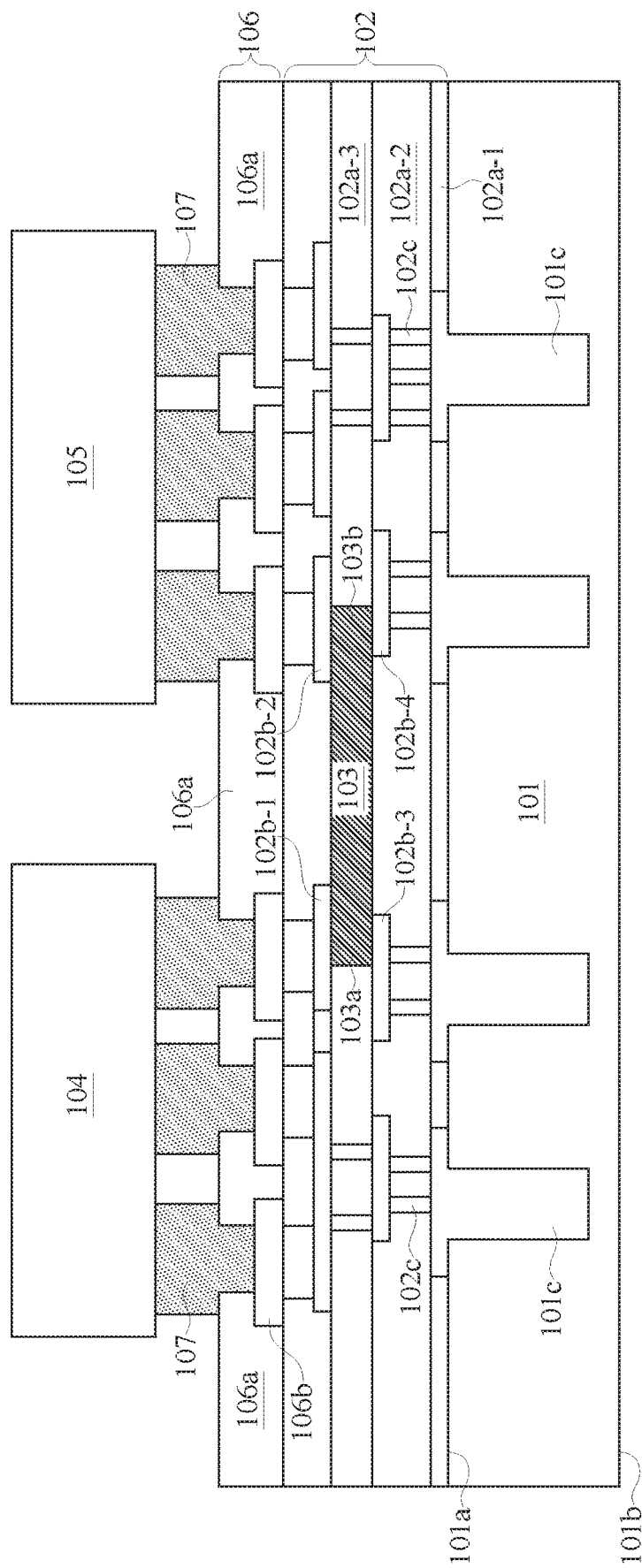

In operation 405, a first die 104 is formed and disposed over the RDL 106 as shown in FIG. 4L. In some embodiments, the first die 104 is bonded to the substrate 101. In some embodiments, the first die 104 is a transmission die or a driver die. In some embodiments, the first die 104 includes a transmission circuit or a transmitter. In some embodiments, the transmission circuit of the first die 104 is configured to generate an electrical signal. In some embodiments, the first die 104 is electrically connected to the first conductive member 102b-1 or the third conductive member 102b-3. In some embodiments, the electrical signal is transmitted from the first die 104 to the first conductive member 102b-1 or the third conductive member 102b-3 with reference to FIG. 3A or FIG. 3B. In some embodiments, the first die 104 has a configuration similar to the configuration of the first die described with reference to FIG. 1 or 2.

In some embodiments, the first die 104 is electrically connected to the conductive members 102b or the conductive vias 102c through the second conductive bumps 107. In some embodiments, the second conductive bumps 107 are disposed between the first die 104 and the RDL 106 to electrically connect the first die 104 to the first conductive member 102b-1 or the third conductive member 102b-3. In some embodiments, the second conductive bumps 107 are bonded to the second pads 106b, such that the first die 104 is electrically connected to the vias 101c, the conductive members 102b or the conductive vias 102c. In some embodiments, the electrical signal from the first die 104 is transmitted to the first conductive member 102b-1 or the third conductive member 102b-3 through the second conductive bumps 107.

In operation 406, a second die 105 is formed and disposed over the RDL 106 as shown in FIG. 4L. In some embodiments, the second die 105 is disposed adjacent to and spaced apart from the first die 104. In some embodiments, the second die 105 is a receiving die or a receiver die. In some embodiments, the second die 105 includes a receiving circuit or a receiver. In some embodiments, the receiving circuit of the second die 105 is configured to receive the electrical signal. In some embodiments, the second die 105 is electrically connected to the second conductive member 102b-2 or the fourth conductive member 102b-4. In some embodiments, the electrical signal generated from the first die 104 is converted to an electromagnetic signal, and the electromagnetic signal is transmitted from the first die 104, through the waveguide 103 and to the second conductive member 102b-2 or the fourth conductive member 102b-4. The electromagnetic signal is then converted to an electrical signal received by the second die 105, such that the electrical signal from the first die 104 is transmitted to the second die 105 through the waveguide 103. In some embodiments, the second die 105 has a configuration similar to the configuration of the second die described with reference to FIG. 1 or 2.

In some embodiments, the second die 105 is electrically connected to the conductive member 102b or the conductive via 102c through the second conductive bump 107. In some embodiments, the second conductive bump 107 is disposed between the second die 105 and the RDL 106 to electrically connect the second die 105 to the second conductive member 102b-2 or the fourth conductive member 102b-4. In some embodiments, the second conductive bumps 107 are bonded to the second pads 106b, such that the second die 105 is electrically connected to the vias 101c, the conductive members 102b or the conductive vias 102c. In some embodiments, the electrical signal transmitted through the waveguide 103, the third conductive member 102b-3 or the fourth conductive member 102b-4 is received by the second die 105 through the second conductive bumps 107.

Figure 4M:
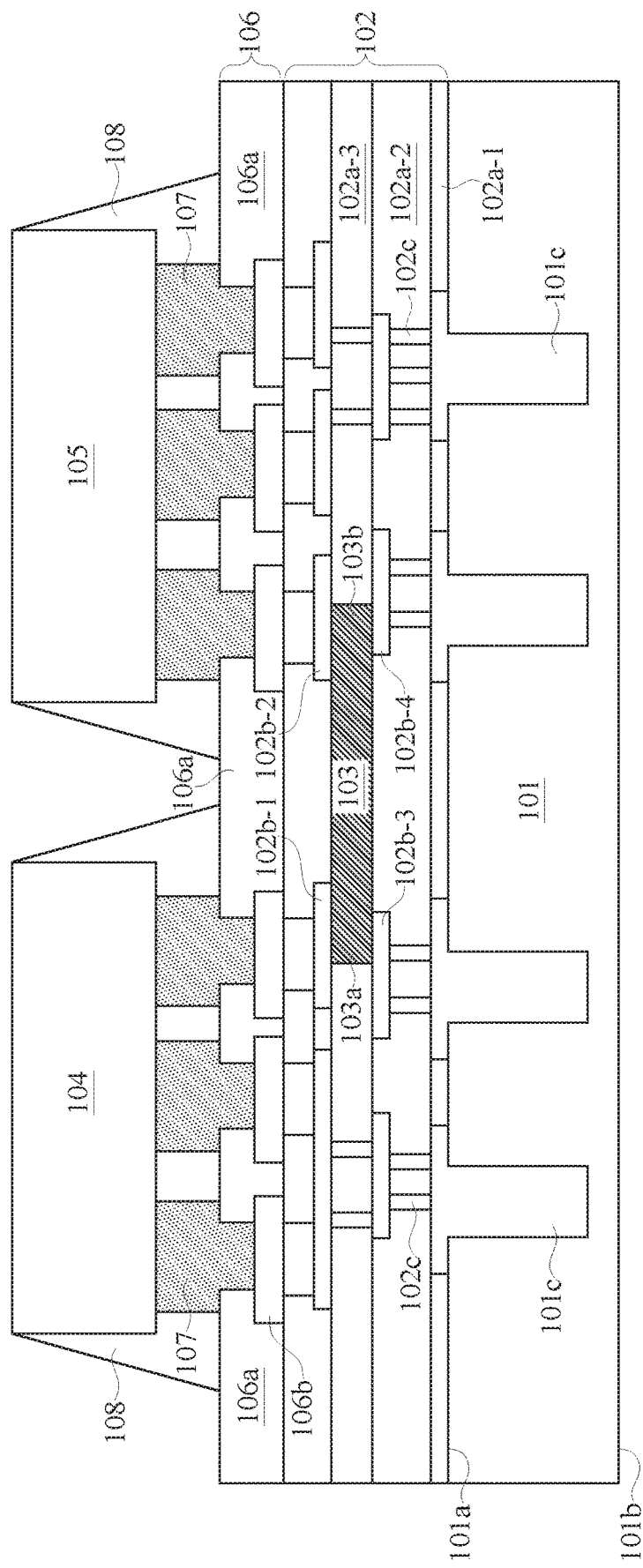

In some embodiments, after the disposing of the first die 104 and the second die 105, an underfill material 108 is disposed to surround the second conductive bumps 107, as shown in FIG. 4M. In some embodiments, the underfill material 108 surrounds the first die 104 and the second die 105 and fills gaps between the adjacent second conductive bumps 107. In some embodiments, the underfill material 108 is disposed by flowing, injection or any other suitable operations. In some embodiments, the underfill material 108 has a configuration similar to the configuration of the underfill material described with reference to FIG. 1 or 2.

Figure 4N:
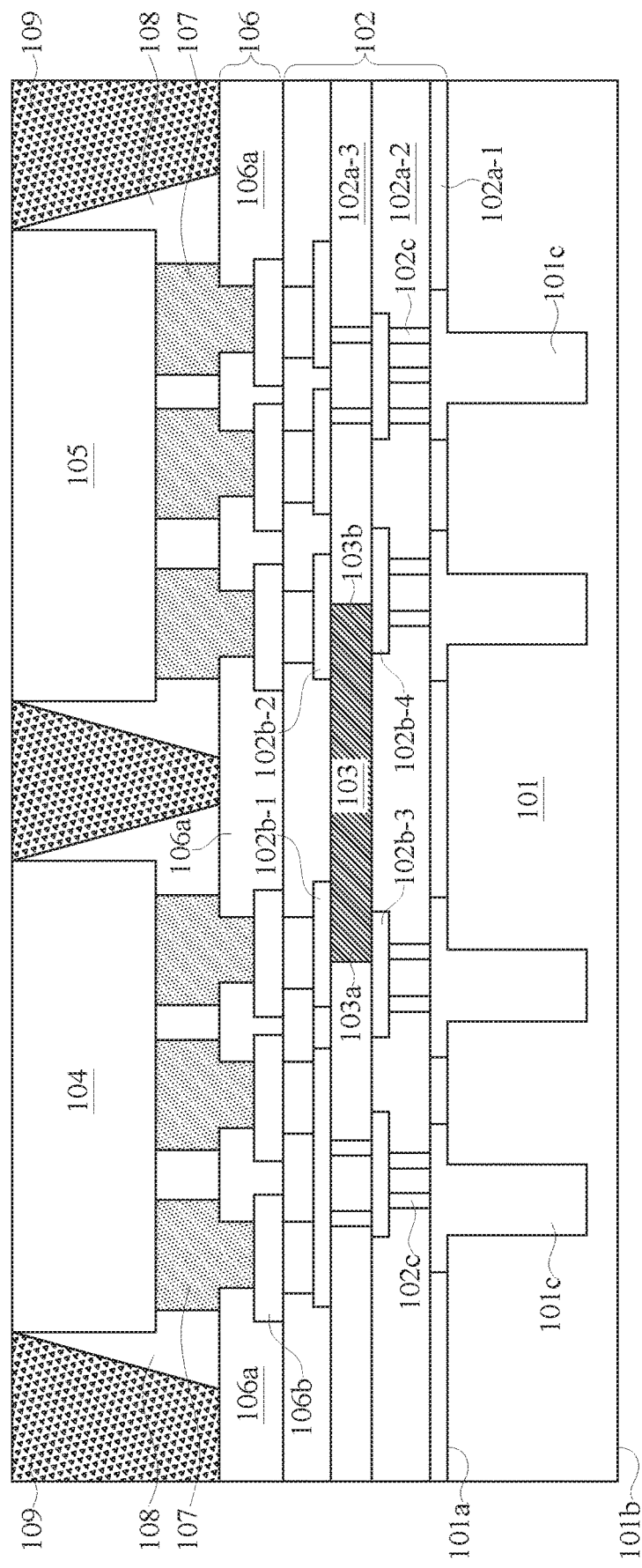

In operation 407, a molding compound 109 is formed, as shown in FIG. 4N. In some embodiments, the molding compound 109 is formed over the RDL 106, the interconnect structure 102 and the substrate 101. In some embodiments, the molding compound 109 surrounds the first die 104, the second die 105, the underfill material 108 and the second conductive bumps 107. In some embodiments, the molding compound 109 is formed by transfer molding, injection molding, over molding or any other suitable operation. In some embodiments, the molding compound 109 is ground to expose a surface of the first die 104 or the second die 105. In some embodiments, the molding compound 109 is ground by grinding, planarization, chemical mechanical polish (CMP) or any other suitable operation. In some embodiments, the molding compound 109 has a configuration similar to the configuration of the molding compound described with reference to FIG. 1 or 2.

Figure 4O:
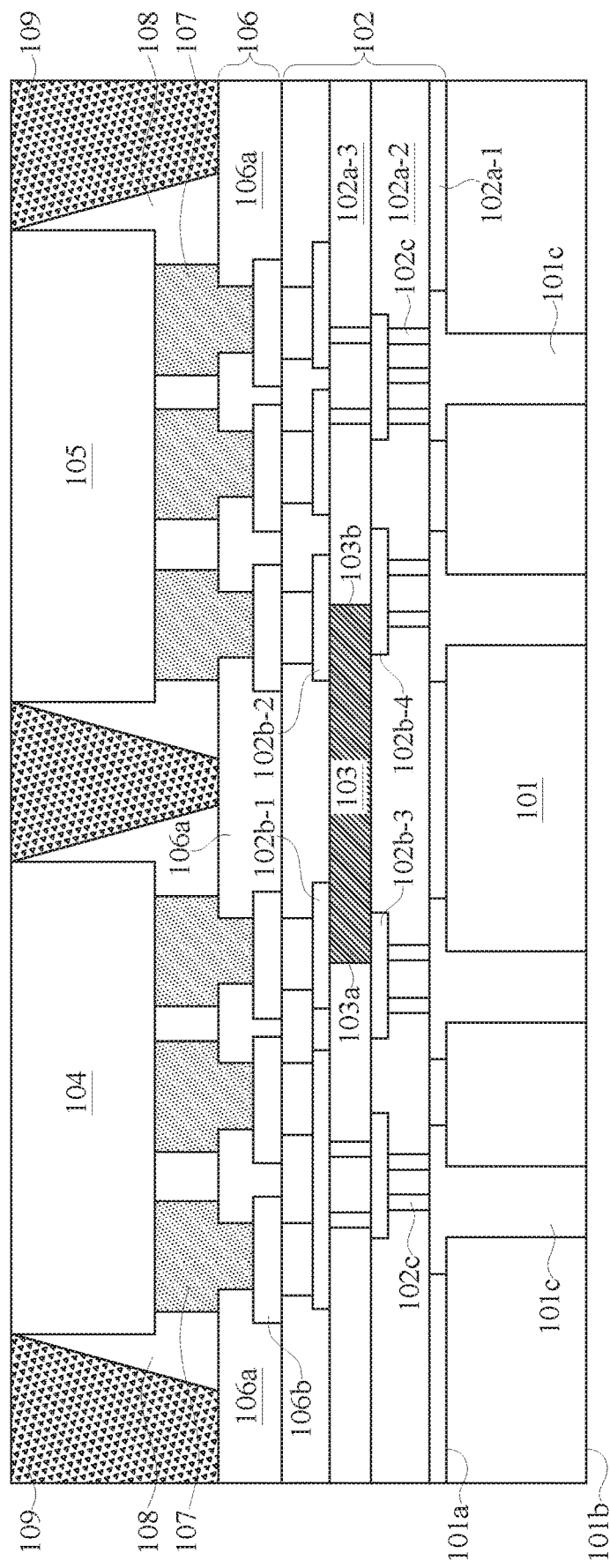
Figure 4P:
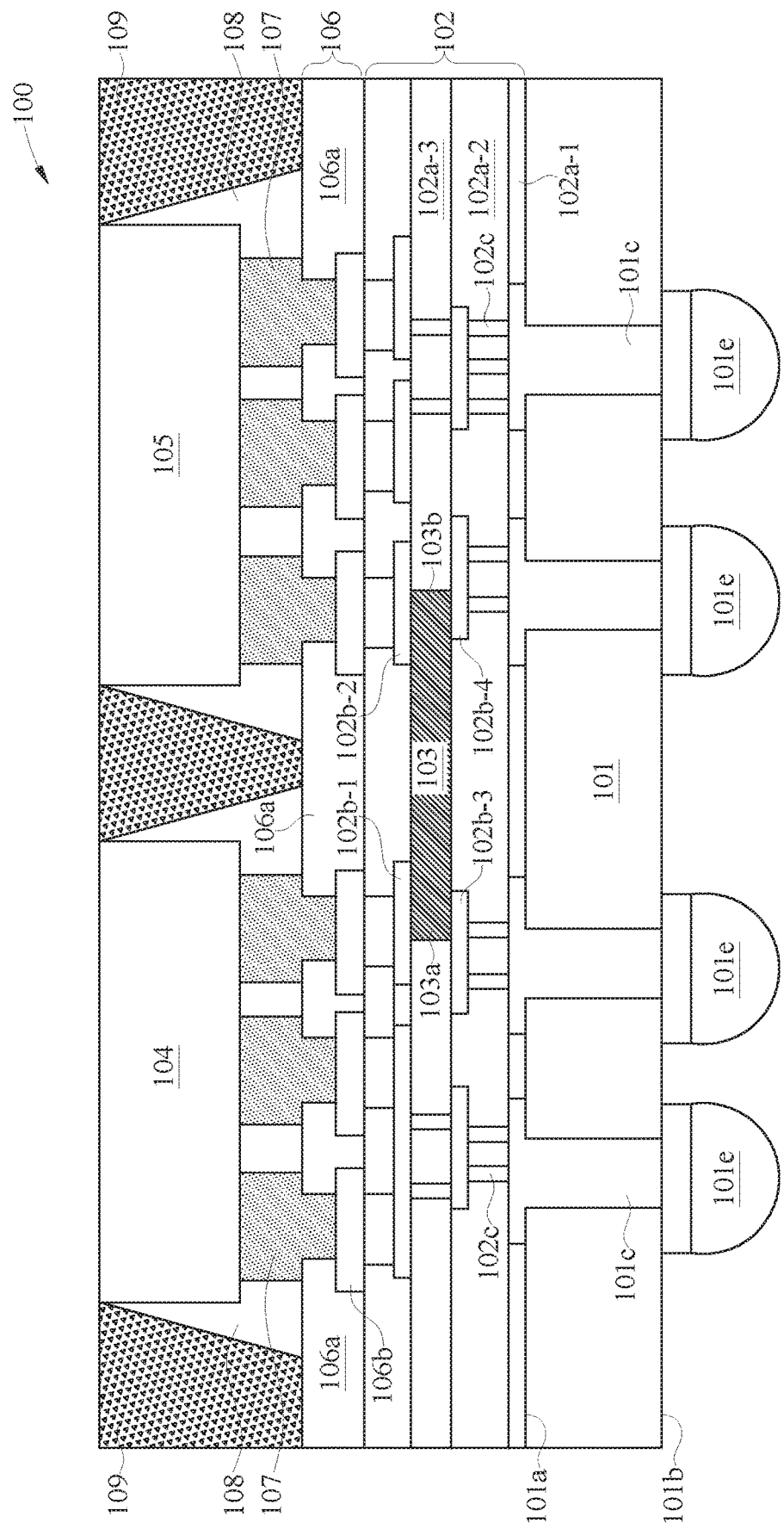

In some embodiments, the substrate 101 is ground from the second surface 101b to expose the vias 101c as shown in FIG. 4O. In some embodiments, the second surface 101b is ground to become a new second surface 101b'. In some embodiments, a carrier is temporarily attached to the first die 104, the second die 105 and the molding compound 109 by an adhesive, and then the substrate 101 is ground from the second surface 101b. In some embodiments, the carrier includes silicon or glass. In some embodiments, the adhesive is a light to heat conversion (LTHC) release film, UV glue, epoxy, or the like. In some embodiments, the substrate 101 is ground by backside grinding, CMP or any other suitable operations.

In some embodiments, a first pad 101d is formed over the substrate 101 as shown in FIG. 4P. In some embodiments, the first pads 101d are formed over the new second surface 101b' of the substrate 101. In some embodiments, the first pads 101d are formed over and electrically connected to the corresponding vias 101c. In some embodiments, the first pads 101d are formed by disposing a conductive material over the substrate 101. In some embodiments, the forming of the conductive material includes sputtering, electroplating or any other suitable operations. In some embodiments, the first pads 101d have configurations similar to the configurations of the pads described with reference to FIG. 1 or 2.

In some embodiments, one or more first conductive bumps 101e are fabricated over the substrate 101. In some embodiments, the first conductive bumps 101e are electrically connected to the conductive members 102b through the vias 101c. In some embodiments, the first conductive bumps 101e are electrically connected to the first conductive member 102b-1, the second conductive member 102b-2, the third conductive member 102b-3 or the fourth conductive member 102b-4 through the vias 101c. In some embodiments, the first conductive bumps 101e are disposed over the first pads 101d. In some embodiments, the first conductive bumps 101e are disposed before or after the formation of the waveguide 103. In some embodiments, the first conductive bump 101e is disposed before the disposing of the first die 104 and the second die 105. In some embodiments, the first conductive bumps 101e are fabricated by ball dropping, solder pasting, stencil printing or any other suitable operations. In some embodiments, the first conductive bumps 101e are reflowed after the fabrication. In some embodiments, the first conductive bumps 101e have configurations similar to the configurations of the first conductive bumps described with reference to FIG. 1 or 2. In some embodiments, a dicing operation is performed to divide the semiconductor structure 100 into individual dies. The dicing or singulation operation may be performed by a laser blade or the like. In some embodiments, a semiconductor structure 100 is formed, wherein the semiconductor structure 100 has a configuration similar to the configuration of the semiconductor structure described with reference to FIG. 1.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

According to an embodiment, a method of manufacturing a semiconductor structure includes: providing a substrate; depositing a first dielectric layer over the substrate; attaching a waveguide to the first dielectric layer; depositing a second dielectric layer to laterally surround the waveguide; and forming a first conductive member and a second conductive member over the second dielectric layer and the waveguide, wherein the first conductive member and the second conductive member are in contact with the waveguide. The waveguide is configured to transmit an electromagnetic signal between the first conductive member and the second conductive member.

According to an embodiment, a method of manufacturing a semiconductor structure includes: depositing a dielectric layer over a substrate; forming a first conductive member and a second conductive member over the dielectric layer; bonding a first end and a second end of a waveguide to the first conductive member and the second conductive member, respectively; and forming a third conductive member and a fourth conductive member to contact the first end and the second end, respectively, of the waveguide.

According to an embodiment, a semiconductor structure includes a substrate and a redistribution layer disposed over the substrate. The redistribution layer includes: a first dielectric layer over the substrate; a first conductive member and a second conductive member within the first dielectric layer; a waveguide over the first dielectric layer and bonded to the first conductive member and the second conductive member; a second dielectric layer laterally surrounding the waveguide; a third conductive member and a fourth conductive member coupled to the waveguide; and a fifth conductive member within the first dielectric layer and between the first conductive member and a surface of the substrate. The semiconductor structure further includes a semiconductor die over the redistribution layer and electrically connected to the first conductive member.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor structure, comprising:
   providing a substrate;
   depositing a first dielectric layer over the substrate;
   attaching a waveguide to the first dielectric layer;
   depositing a second dielectric layer to laterally surround the waveguide;
   forming a first conductive member and a second conductive member over the second dielectric layer and the waveguide, the first conductive member and the second conductive member being in contact with the waveguide; and
   forming a conductive bump on the substrate to electrically connect the first conductive member or the second conductive member to the conductive bump by a conductive via extending through the substrate,
   wherein the waveguide is configured to transmit an electromagnetic signal between the first conductive member and the second conductive member.

2. The method of claim 1, further comprising, prior to the attaching of the waveguide to the first dielectric layer, attaching the waveguide to a carrier and aligning the waveguide to a location between the first conductive member and the second conductive member.

3. The method of claim 2, further comprising detaching the carrier from the waveguide and performing a thermal operation on the semiconductor structure subsequent to the detachment.

4. The method of claim 1, further comprising annealing the semiconductor structure subsequent to the attaching of the waveguide to the first dielectric layer.

5. The method of claim 1, further comprising, prior to attaching the waveguide to the first dielectric layer, fabricating the waveguide in a first chamber different from a second chamber for depositing the first dielectric layer.

6. The method of claim 5, wherein the fabricating of the waveguide comprises fabricating the waveguide at a first temperature greater than a second temperature at which the first dielectric layer is deposited.

7. The method of claim 1, further comprising forming a third conductive member and a fourth conductive member aligned with the first conductive member and the second conductive member, respectively, wherein the third conductive member and the fourth conductive member are in contact with the waveguide.

8. The method of claim 7, wherein at least a portion of the waveguide between the first conductive member and the third conductive member or between the second conductive member and the fourth conductive member is formed as a resonant cavity and conducts conversion between the electromagnetic signal and an electrical signal.

9. The method of claim 8, further comprising disposing a first die and a second die over the first dielectric layer, wherein at least one of the first die and the second die comprises a circuit configured to generate the electrical signal to be converted to the electromagnetic signal.

10. The method of claim 1, wherein a dielectric constant of the waveguide is substantially greater than a dielectric constant of the second dielectric layer.

11. The method of claim 1, further comprising disposing a first die and a second die over the first conductive member and the second conductive member, respectively.

12. The method of claim 1, wherein the first conductive member and the second conductive member laterally extend over the second dielectric layer.

13. A method of manufacturing a semiconductor structure, comprising:
   depositing a dielectric layer over a substrate;
   forming a first conductive member and a second conductive member over the dielectric layer;
   bonding a first end and a second end of a waveguide to the first conductive member and the second conductive member, respectively;
   forming a third conductive member and a fourth conductive member to contact the first end and the second end, respectively, of the waveguide; and
   forming a conductive bump over the substrate to electrically connect the first conductive member or the second conductive member to the conductive bump by a conductive via extending through the substrate.

14. The method of claim 13, further comprising fabricating the waveguide before the bonding of the waveguide to the first and second conductive members.

15. The method of claim 13, further comprising:
disposing a first die and a second die over the first conductive member and the second conductive member, respectively; and
forming a conductive bump between the first die and the dielectric layer or between the second die and the dielectric layer to electrically connect the first die to the first conductive member or the second die to the second conductive member.

16. The method of claim 13, further comprising forming a fifth conductive member and a sixth conductive member electrically coupled to the first end and the second end, respectively, of the waveguide.

17. The method of claim 16, further comprising electrically connecting the first, the second, the fifth and the sixth conductive members to ground.

18. The method of claim 13, further comprising forming a seventh conductive member on a side of the first and the second conductive members opposite to the waveguide and electrically grounding the seventh conductive member.

19. A method of manufacturing a semiconductor structure, comprising:
manufacturing a waveguide in a first chamber at a first temperature;
providing a substrate to a second chamber;
depositing a first dielectric layer over the substrate;
attaching the waveguide to the first dielectric layer;
depositing a second dielectric layer to laterally surround the waveguide;
forming a first conductive member and a second conductive member over the second dielectric layer and the waveguide, the first conductive member and the second conductive member being in contact with the waveguide; and
disposing a conductive bump over the substrate to electrically connect the first conductive member or the second conductive member to the conductive bump by a conductive via extending through the substrate,
wherein the waveguide is configured to transmit an electromagnetic signal between the first conductive member and the second conductive member,
wherein at least one of the providing, the depositing, the attaching, and the forming in the second chamber is performed at a second temperature lower than the first temperature.

20. The method of claim 19, wherein the manufacturing of the waveguide comprises performing powder metallurgy.

* * * * *